United States Patent
McNie et al.

(10) Patent No.: US 9,412,566 B2
(45) Date of Patent: Aug. 9, 2016

(54) METHODS AND APPARATUS FOR DEPOSITING AND/OR ETCHING MATERIAL ON A SUBSTRATE

(71) Applicant: Oxford Instruments Nanotechnology Tools Limited, Oxon (GB)

(72) Inventors: Mark Edward McNie, Bromsgrove (GB); Michael Joseph Cooke, Bristol (GB); Leslie Michael Lea, Didcot (GB)

(73) Assignee: Oxford Instruments Nanotechnology Tools Limited (GB)

( * ) Notice: Subject to any disclaimer, the term of this patent is extended or adjusted under 35 U.S.C. 154(b) by 0 days.

(21) Appl. No.: 14/381,508

(22) PCT Filed: Feb. 27, 2013

(86) PCT No.: PCT/GB2013/050481
§ 371 (c)(1),
(2) Date: Aug. 27, 2014

(87) PCT Pub. No.: WO2013/128181
PCT Pub. Date: Sep. 6, 2013

(65) Prior Publication Data
US 2015/0011088 A1    Jan. 8, 2015

(30) Foreign Application Priority Data
Feb. 29, 2012   (GB) .................................. 1203530.9

(51) Int. Cl.
*H01J 37/32* (2006.01)
*H01L 21/3065* (2006.01)
(Continued)

(52) U.S. Cl.
CPC ........... *H01J 37/32926* (2013.01); *C23C 16/50* (2013.01); *C23C 16/52* (2013.01);
(Continued)

(58) Field of Classification Search
CPC .... C23C 16/52; C23C 16/50; H01J 37/32917; H01J 37/32449; H01J 37/32926; H01J 37/32816; H01J 37/32834; H01J 2237/3321; H01L 21/30655; H01L 22/26; H01L 21/306; H01L 22/12; G05B 19/418
See application file for complete search history.

(56) References Cited

U.S. PATENT DOCUMENTS

| 5,501,893 A | 3/1996 | Laermer et al. |
| 5,935,336 A | 8/1999 | Sandhu et al. |

(Continued)

FOREIGN PATENT DOCUMENTS

| DE | 4241045 C1 | 5/1992 |
| EP | 625285 B1 | 11/1993 |

(Continued)

OTHER PUBLICATIONS

Flannery, Anthony F., PECVD Silicon Carbide for Micromachined Transducers; Int'l Conf. On Solid-State Sensors and Actuators; New York, NY; IEEE; Jun. 1997; pp. 217-220; vol. 1.

(Continued)

*Primary Examiner* — Duy Deo
(74) *Attorney, Agent, or Firm* — Blank Rome LLP

(57) ABSTRACT

Methods are disclosed for depositing material onto and/or etching material from a substrate in a surface processing tool having a processing chamber, a controller and one or more devices for adjusting the process parameters within the chamber. The method comprises: the controller instructing the one or more devices according to a series of control steps, each control step specifying a defined set of process parameters that the one or more devices are instructed to implement, wherein at least one of the control steps comprises the controller instructing the one or more devices to implement a defined set of constant process parameters for the duration of the step, including at least a chamber pressure and gas flow rate through the chamber, which duration is less than the corresponding gas residence time ($T_{gr}$) of the processing chamber for the step.

27 Claims, 7 Drawing Sheets

(51) Int. Cl.
*C23C 16/52* (2006.01)
*C23C 16/50* (2006.01)
*G05B 19/418* (2006.01)
*H01L 21/306* (2006.01)
*H01L 21/66* (2006.01)

(52) U.S. Cl.
CPC ........ *G05B 19/418* (2013.01); *H01J 37/32449* (2013.01); *H01J 37/32816* (2013.01); *H01J 37/32834* (2013.01); *H01J 37/32917* (2013.01); *H01L 21/306* (2013.01); *H01L 21/30655* (2013.01); *H01L 22/26* (2013.01); *G05B 2219/34198* (2013.01); *H01J 2237/248* (2013.01); *H01J 2237/24564* (2013.01); *H01J 2237/24585* (2013.01); *H01J 2237/334* (2013.01); *H01J 2237/3321* (2013.01); *H01L 22/12* (2013.01)

(56) References Cited

U.S. PATENT DOCUMENTS

| | | | |
|---|---|---|---|
| 6,051,503 A | 4/2000 | Bhardwaj et al. | |
| 6,187,685 B1 | 2/2001 | Hopkins et al. | |
| 6,261,962 B1 * | 7/2001 | Bhardwaj | H01L 21/30655 257/E21.235 |
| 6,749,763 B1 * | 6/2004 | Imai | H01L 21/31116 216/59 |
| 6,818,564 B1 | 11/2004 | Gormley | |
| 6,926,844 B1 | 8/2005 | Laermer et al. | |
| 7,217,658 B1 | 5/2007 | Bayman et al. | |
| 2004/0019408 A1 | 1/2004 | del Puerto et al. | |
| 2004/0124177 A1 | 7/2004 | Urban et al. | |
| 2005/0153570 A1 | 7/2005 | Matsuyama et al. | |
| 2005/0186806 A1 | 8/2005 | Shin | |
| 2006/0223324 A1 | 10/2006 | Ikegami | |
| 2007/0004204 A1 | 1/2007 | Fukazawa et al. | |
| 2007/0251642 A1 | 11/2007 | Bera et al. | |
| 2007/0281489 A1 | 12/2007 | Pandhumsoporn et al. | |
| 2009/0004801 A1 | 1/2009 | Ahn et al. | |
| 2011/0136269 A1 | 6/2011 | Du et al. | |
| 2011/0207323 A1 * | 8/2011 | Ditizio | B81C 1/00087 438/675 |
| 2011/0318930 A1 | 12/2011 | Jeon et al. | |

FOREIGN PATENT DOCUMENTS

| EP | 0822582 A2 | 2/1998 |
|---|---|---|
| EP | 1131847 B1 | 9/2001 |
| WO | 2005045904 A2 | 5/2005 |

OTHER PUBLICATIONS

Banna, S. et al.; "Inductively Coupled Pulsed Plasmas in the Presence of Synchronous Pulsed Substrate Bias for Robust, Reliable, and Fine Conductor Etching"; IEEE Transactions on Plasma Science, vol. 37, No. 9, Sep. 2009 (17 pages).

* cited by examiner

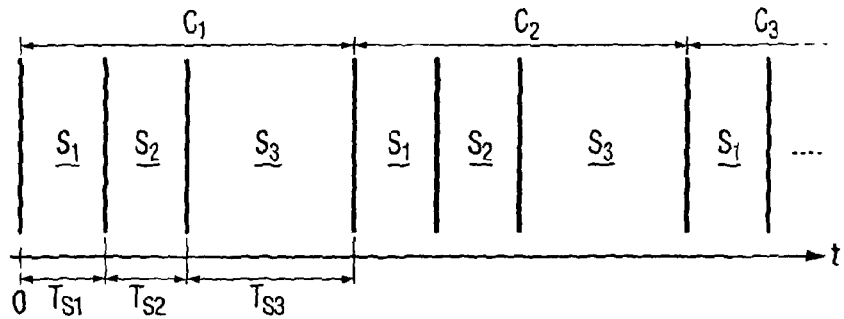
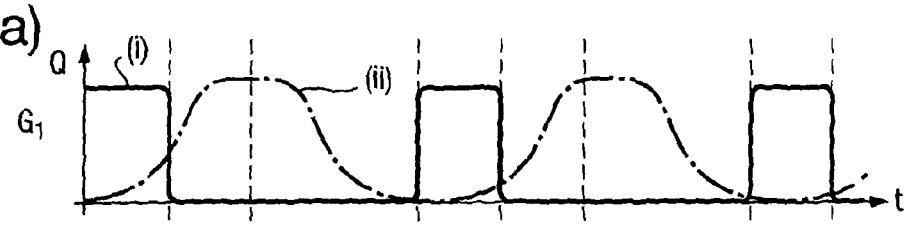
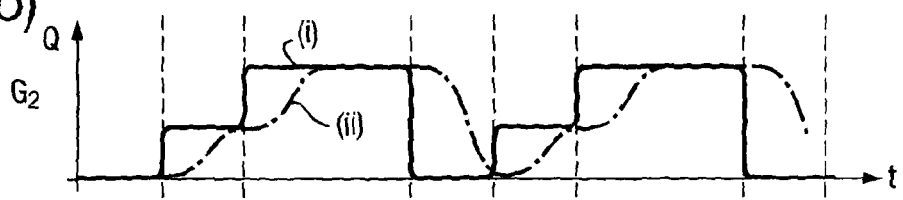
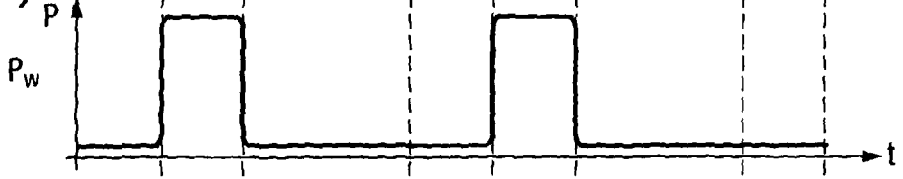
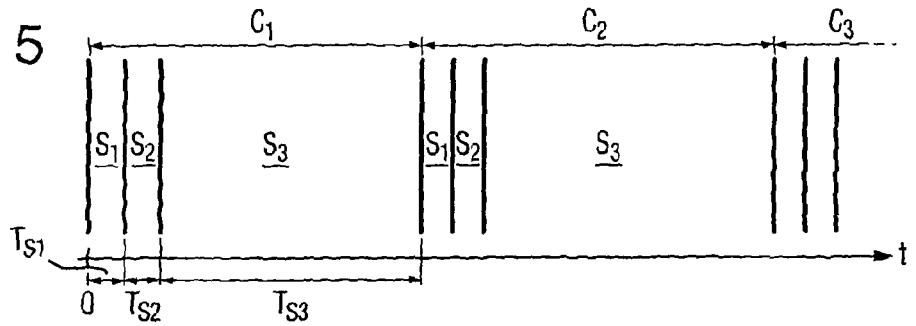

METHODS AND APPARATUS FOR DEPOSITING AND/OR ETCHING MATERIAL ON A SUBSTRATE

REFERENCE TO RELATED APPLICATIONS

The present application is a U.S. National Stage Application of PCT/GB2013/050481, filed Feb. 27, 2013, which claims benefit to GB1203530.9, filed Feb. 29, 2012, whose disclosures are hereby incorporated by reference in their entirety into the present disclosure.

This invention relates to methods for depositing and/or etching material on a substrate in a surface processing tool, and apparatus therefor. The disclosed technique can be advantageously applied to any deposition or etching process, which may or may not be plasma-enhanced, including the "Bosch process" for etching features into a substrate, such as a silicon wafer.

Many surface processing processes, such as material deposition or etching, involve performing a series of different processing steps. For example, chemical vapour deposition (CVD) processes often involve the depositions of different materials in sequence in order to form layered structures of more than one material. In plasma enhanced CVD (PECVD) and other plasma enhanced surface processing methods, a series of steps may also be implemented in order to initially strike the plasma and then to stabilise it for use in subsequent processing.

Another example is the "Bosch process" which is described for instance in DE-A-4241045 and U.S. Pat. No. 5,501,893, and a modified version in EP-A-1131847. This is a method of etching a feature into a substrate such as a silicon wafer. A mask is applied to the surface of the wafer to define the lateral dimensions of the desired feature. The wafer is then subject to a series of alternating passivation (deposition) and etching steps, repeated many times. In the passivation step, a passivation material such as a layer of polymer is deposited on all surfaces of the wafer, including the area to be etched and the mask. In the etching step, the wafer is subject to selective etching (by imposing directionality on to the process), which preferentially removes the passivation layer from the base of the feature, leaving the side walls coated (passivation material deposited on the mask or other surface having the same orientation as the feature base, e.g. horizontal, will be removed too). Continued etching then etches the exposed substrate material predominantly isotropically. As the depth of the feature increases, this isotropic etching also removes substrate material from the new side walls since they are not passivated.

By alternating the passivation and etching steps, the amount of side wall etching can be reduced since the new side walls will be passivated at frequent intervals, hence reducing sideways growth of the feature. In this way, the lateral extent of the etch feature can be more accurately controlled throughout its full depth. However, the side walls will still exhibit a pattern of recesses (commonly termed "scallops") which prevent the side walls from being truly smooth and thus reduce the positional accuracy of the walls. Smooth sidewalls are also preferred in order to achieve good results in subsequent processes that may deposit material on the sidewalls or fill the etched feature, for instance. As an example, electrical contact paths may be formed by conformal deposition of an insulating layer prior to the filling of a through-silicon via by a conductive material. It is therefore desirable to minimise the size of the scallops.

The alternating passivation and etching mechanisms are implemented by controlling process parameters within a processing chamber housing the substrate in a series of steps. Relevant process parameters may include: the type of gas(es) input to the chamber (i.e. precursor gas(es) and/or carrier gas(es)), the mass flow rate(s) of the input gas(s), chamber pressure, temperature and, if used, the plasma conditions. A DC or AC bias voltage may also be applied to the substrate in order to promote ion flux towards the substrate (i.e. directionality) and if so its parameters (e.g. power, frequency) may be relevant. Together, the set of process parameters established within the chamber at any one time determines the nature of the process step that will take place at that time. For instance, in the passivation step of the Bosch process, the input gas will be a passivation gas (e.g. $C_4F_8$) and preferably little or no ion flux to the substrate (i.e. no directionality). In contrast, in the etching step, the input gas will be an etching gas (e.g. $SF_6$) and high directionality is desired. There will typically also be a different preferred chamber pressure for each step.

The process parameters are adjusted by a set of (one or more) devices which control conditions within the processing chamber. These may include, for example, one or more mass flow controllers for admitting one or more respective input gases to the chamber at a specified rate; one or more plasma sources such as an ICP (inductively coupled plasma) or CCP (capacitively coupled plasma); a substrate bias voltage source (DC or AC); an exhaust pump, a pressure control valve and one or more heater(s) and/or cooling system(s) for adjusting the temperature of the substrate and/or the processing chamber. Typically a controller such as a PLC (programmable logic controller) is provided to provide commands to the devices across a network or bus according to a pre-programmed routine.

Each step of the routine involves instructing the devices to set appropriate process parameters within the chamber for the process step which is to be implemented. There is an inherent delay in establishing the desired conditions within the chamber for each step since the atmosphere within the chamber will take a finite amount of time to transition and reflect an adjustment by one of the devices. Thus the minimum duration of each process step has conventionally been limited by the speed at which one gas condition existing in the chamber can be replaced by another, after changes to the devices' outputs. As such, typical process steps have a duration of several seconds or more. For instance, in U.S. Pat. No. 5,501,893, a passivation step with a duration of one minute is disclosed, and the subsequent etching step has a duration between 6 seconds and 1.5 minutes. EP-A-1131847 discloses passivation and etching steps of between 5 and 12 seconds' duration. Such durations are necessary in order to achieve steady state conditions for each process step at (or near) the desired process parameters. The same considerations apply to other multi-step deposition and/or etching processes.

A first aspect of the present invention provides a method for depositing material onto and/or etching material from a substrate in a surface processing tool having a processing chamber, a controller and one or more devices for adjusting the process parameters within the chamber, the method comprising: the controller instructing the one or more devices according to a series of control steps, each control step specifying a defined set of process parameters that the one or more devices are instructed to implement, wherein at least one of the control steps comprises the controller instructing the one or more devices to implement a defined set of constant process parameters for the duration of the step, including at least a chamber pressure and gas flow rate through the chamber, which duration is less than the corresponding gas residence time ($T_{gr}$) of the processing chamber for the step, which is defined as:

$$T_{gr} = \frac{pV}{Q}$$

Where:
p is the chamber pressure in units of Pa;
V is the volume of the processing chamber in units of $m^3$; and
Q is the gas flow rate through the processing chamber in units of $Pa \cdot m^3 \cdot s^{-1}$.

The gas residence time of a chamber is a measure of how rapidly it should be possible to change from one gas to another within the chamber, i.e. how quickly one set of conditions can be substituted for another, under a certain pressure and flow rate. The present inventors have found that, surprisingly, short control steps having a duration less than the corresponding gas residence time do have an effect on the process conducted within the chamber and are highly effective despite there being insufficient time for the chamber to reach steady state conditions during the step. The use of short control steps of this sort can be used to achieve significant process benefits, as discussed in more detail below.

It should be noted that references to a "substrate" throughout this disclosure encompass base substrates such as unmodified silicon or sapphire wafers, as well as processed substrates which may have a multilayer structure. Hence the etching of material from a substrate refers to either etching the base material or etching a deposited layer on the substrate, or both.

"Instructing" refers to the issuing of commands to the device(s) by the controller, hence the process parameters defined in each control step refer to the values which the devices are instructed to implement, rather than the actual conditions within the chamber.

Each process step is distinguished from the next by virtue of at least one instructed process parameter being different in consecutive steps. In other words, the beginning and end points of each process step will be characterised by a change in at least one instructed process parameter, preferably a parameter in which a change will give rise to different gas conditions (e.g. gas type, gas flow rate, pressure or exhaust pumping speed) within the chamber.

In preferred implementations, the corresponding gas residence time of the processing chamber for the at least one of the control steps is between 0.1 and 5 seconds, preferably between 0.5 and 2 seconds, still preferably approximately 1 second. Advantageously, the at least one of the control steps has a duration of less than 1 second, preferably less than or equal to 750 milliseconds, more preferably less than or equal to 500 milliseconds, further preferably less than or equal to 100 milliseconds, still preferably less than or equal to 50 milliseconds, most preferably between 5 and 50 milliseconds. In practice, the series of control steps will typically include steps of differing duration, some or all of which will be less than the corresponding gas residence times.

The disclosed techniques can be advantageously applied to a Bosch-type process. For example, in an advantageous embodiment, a first sequential subset of one or more of the series of control steps constitutes a passivation process phase during which the processing parameters are selected for depositing a passivation layer on the substrate, and a second sequential subset of one or more of the series of control steps constitutes an etching process phase during which the processing parameters are selected for etching the substrate, and wherein the first and second sequential subsets of control steps form a cycle which is repeated such that the passivation process phase and etching process phase are performed alternately. By configuring one or more of the steps to have a duration less than the corresponding gas residence time, the overall cycle time can be significantly reduced as compared with conventional Bosch processes. In exemplary embodiments, for instance, the total duration of the cycle is less than 10 seconds, preferably less than or equal to 5 seconds, more preferably less than or equal to 3 seconds, most preferably less than or equal to 2 seconds. For a constant etch speed, this reduces the size of the "scallops" formed in the side walls. Alternatively, the shorter cycle time can be used to enable the use of faster etch rates without compromising on scallop size.

In particularly preferred embodiments, the second sequential subset of control steps constituting the etching process phase comprises a first portion during which the processing parameters are selected for partial removal (e.g. removal from certain surfaces only, such as the base of the feature to be etched) of the passivation layer in a passivation layer removal process sub-phase, and a second portion during which the processing parameters are selected for etching of the exposed substrate in a substrate etch process sub-phase. Dividing the etching phase into two discrete parts in this way improves mask selectivity (i.e. promotes etching of the substrate rather than the mask defining the feature to be etched), by confining the physical etching mechanism of ion bombardment to an initial portion of the phase sufficient to remove the passivation layer at least from the base of the feature whilst leaving mask material substantially intact. During the second part of the step, ion bombardment is stopped or reduced such that the etching proceeds via a predominantly chemical mechanism, such that only the exposed material which is to be etched will be removed.

The use of short process steps of the sort disclosed also enables an improvement in the efficiency of the Bosch process since the proportion of the cycle during which etching of the substrate material takes place can be increased without requiring an undesirably long cycle time. Advantageously, at least 50% of the total duration of the cycle corresponds to the substrate etch process sub-phase, preferably at least 60%, more preferably at least 70%, still preferably between 80% and 99%, most preferably between 80% and 90%.

In preferred embodiments, the passivation process phase has a duration of between 50 and 1000 milliseconds, preferably between 50 and 500 milliseconds, more preferably between 50 and 250 milliseconds, still preferably between 100 and 200 milliseconds. The passivation layer removal process sub-phase preferably has a duration of between 50 and 1000 milliseconds, preferably between 50 and 500 milliseconds, more preferably between 50 and 250 milliseconds, still preferably between 100 and 200 milliseconds. For the reasons discussed above, the substrate etch process sub-phase is preferably longer, having a duration of between 100 milliseconds and 2 seconds for example, preferably between 500 milliseconds and 1.5 seconds, more preferably between 750 milliseconds and 1.25 seconds.

In a practical surface processing tool, if significantly different process conditions are desirable for adjacent steps of a process this can lead to difficulties including plasma instability, potentially leading to extinguishing of the plasma. In particularly preferred embodiments, this is addressed by at least one of the process phases and sub-phases comprising a core process step and one or more intermediate control steps before and/or after the core process step, the or each of the intermediate control steps comprising instructing the one or more devices to implement a defined set of constant process parameters of which at least one has a value which lies between that of the same process parameter in the core process step and in the preceding or subsequent process phase or sub-phase. By inserting intermediate control steps of this sort between the process steps requiring different processing conditions, the changeover can be controlled to take place over a finite period thereby supporting the maintenance of a stable plasma. At least one, preferably some or all, of the intermediate control steps are advantageously shorter in duration than the corresponding gas residence time, to avoid increasing the cycle time or reducing the efficiency of the cycle significantly. The instructed conditions are constant for the duration of the control step, enabling the controller to retain central control over each of the devices (as opposed to delegating control to local devices by instructing such devices to vary their output over the duration of the step).

This technique can be applied to any or all of the transitions between process phases (or sub-phases) in a Bosch-type process. Thus, in a preferred embodiment, the first sequential subset of control steps constituting the passivation process phase comprises a core passivation step and one or more intermediate control steps before and/or after the core passivation step, the or each of the intermediate control steps comprising instructing the one or more devices to implement a defined set of constant process parameters of which at least one has a value which lies between that of the same process parameter in the core passivation step and in the etching process phase.

In another preferred embodiment, the second sequential subset of control steps constituting the etching process phase comprises a core etching step and one or more intermediate control steps before and/or after the core etching step, the or each of the intermediate control steps comprising instructing the one or more devices to implement a defined set of constant process parameters of which at least one has a value which lies between that of the same process parameter in the core etching step and in the passivation process phase.

Where a modified Bosch process of the sort mentioned above is implemented, the first portion of the second sequential subset of control steps constituting the passivation layer removal process sub-phase preferably comprises a core passivation layer removal step and one or more intermediate control steps before and/or after the core passivation layer removal step, the or each of the intermediate control steps comprising instructing the one or more devices to implement a defined set of constant process parameters of which at least one has a value which lies between that of the same process parameter in the core passivation layer removal step and in the passivation process phase or the substrate etch process sub-phase. Advantageously, during at least one of the control steps constituting the passivation layer removal process sub-phase, preferably the core passivation layer removal step, the process parameters are configured for directional, ion-assisted etching.

Similarly, the second portion of the second sequential subset of control steps constituting the substrate etch process sub-phase preferably comprises a core substrate etch step and one or more intermediate control steps before and/or after the core substrate etch step, the or each of the intermediate control steps comprising instructing the one or more devices to implement a defined set of constant process parameters of which at least one has a value which lies between that of the same process parameter in the core substrate etch step and in the passivation layer removal process sub-phase or the passivation process phase. Advantageously, during at least one of the control steps constituting the substrate etch process sub-phase, preferably the core substrate etch step, the process parameters are configured for substantially isotropic, chemical etching.

The process parameters defined for each step could include any or all parameters such as gas flow rate, temperature, bias conditions, etc. Where there is a change of gas type from one process phase to the next, advantageously in at least one intermediate control step, the one or more devices are instructed to input gas comprising a mixture of the first and second species into the chamber. Thus, in particularly preferred examples, the or each of the intermediate control steps comprises instructing the one or more devices to input gas comprising a mixture of first and second species into the chamber, the core process step comprising instructing the one or more devices to input gas predominantly of the first species into the chamber and the preceding or subsequent process phase or sub-phase comprising instructing the one or more devices to input gas predominantly of the second species into the chamber. For example, the mixture of the first and second species in the at least one intermediate control step may have a ratio of the first species to the second species of between 1:10 to 10:1, by partial pressure, preferably between 1:3 to 3:1, more preferably between 1:2 to 2:1, most preferably around 1:1. Such a gradual change in gas type particularly assists in preventing the extinguishing of the plasma which might otherwise occur upon sudden entry of a different gas. In particularly preferred embodiments, in a plurality of consecutive intermediate control steps, the one or more devices are instructed to input gas comprising respective mixtures of the first and second species into the chamber, wherein the ratio of the first species to the second species in each consecutive mixture varies, whereby a gradual transition from the first gas species to the second is effected.

A single intermediate control step between processes can have an advantageous effect. However in practice it is preferable that the series of control steps includes a plurality of intermediate control steps between at least one pair of adjacent core process steps in the cycle, the defined set of process parameters implemented by each of the intermediate control steps varying from one intermediate control step to the next so as to effect a gradual change in the process parameters between the pair of adjacent core process steps.

In particularly preferred embodiments, wherein the duration of the or each intermediate process step, during which the one or more devices are instructed to implement the defined set of constant intermediate process parameters, is less than the corresponding gas residence time ($T_{gr}$) of the processing chamber for the step. Advantageously, wherein the sum of the duration(s) of the or each intermediate process step between adjacent core process steps in the cycle is less than the average gas residence time ($T_{gr}$) of those intermediate process steps.

The process parameters defined for each control step may include any of: the gas flow rate of at least one input gas, the pressure within the chamber, the exhaust pumping speed, wafer backside gas pressure, plasma source power or frequency, substrate bias power or frequency, and impedance matching settings (such as capacitor or inductor values or the setting positions of corresponding variable components).

In particularly preferred embodiments, the defined set of constant process parameters implemented during the at least one of the control steps having a duration less than the gas residence time ($T_{gr}$) of the processing chamber includes process parameters selected to give rise to different gas conditions (e.g. gas flow rate, pressure, exhaust pumping speed) within the chamber relative to those of the preceding and/or subsequent control steps. Of course, as discussed above, since the duration of the step is less than the gas response time, these instructed values are unlikely to be reached, in terms of the actual chamber conditions, during the same step. Other changes, such as adjustments to the bias power or plasma power, respond relatively quickly and so may be reached.

In general terms, to achieve a high overall etch rate it is desirable to:

Operate the passivation phase at a relatively low chamber pressure (e.g. comparable or less than that of the passivation removal sub-phase, and less than that of the substrate etch sub-phase), usually with little or no ion flux to the substrate (i.e. low plasma power and little or no directionality).

Operate the passivation removal sub-phase again at low pressure but with a high ion flux to the substrate (i.e. higher substrate bias); and Operate the substrate etch sub-phase at a relatively high chamber pressure in order to produce large numbers of reactive species (e.g. fluorine radicals), with little or no ion flux to the substrate, in order to promote mask selectivity.

Thus, in an exemplary implementation, during at least one of the control steps constituting the passivation process phase, preferably the core passivation step, the process parameters include:

the input gas being predominantly a passivation precursor gas;

a chamber pressure preferably between 3 and 12 Pa, more preferably around 7 Pa;

a plasma source power preferably between 1 and 2.5 kW, more preferably between 1.5 and 2 kW; and substantially zero substrate bias power or a bias power density of less than 1500 W/m$^2$, preferably 150 W/m$^2$ or less.

The term "passivation precursor gas" used here refers to a gas which will passivate the substrate at the process parameters implemented. Some gases, such as $C_4F_8$, are capable of either etching or passivating, depending on the processing conditions. Likewise, the term "etching precursor gas", below, refers to a gas which will etch the material to be removed (i.e. the passiviation material and/or the substrate) at the particular process parameters given. Thus the "passivation precursor gas" (or simply "passivation gas") and "etching precursor gas" (or simply "etching gas") may be the same species. Alternatively a different etching gas, such as $SF_6$ or $NF_3$ could be utilised. Different etching gases may also be used during each of the two etching stages.

In a control step of the passivation removal sub-phase, the process parameters configured for directional, ion-assisted etching preferably include:

the input gas being predominantly an etching gas;

a chamber pressure preferably between 1 and 10 Pa, more preferably around 3 Pa;

a plasma source power preferably between 1.5 and 3 kW, more preferably between 2 and 2.5 kW; and a higher substrate bias power density than that implemented during the passivation process phase or during the substrate etch process sub-phase, preferably between 1500 and 8000 W/m$^2$, more preferably between 3000 and 6000 W/m$^2$.

In a control step of the substrate etch sub-phase, the process parameters configured for substantially isotropic, chemical etching preferably include:

the input gas being predominantly an etching gas;

a chamber pressure preferably between 7 and 30 Pa, more preferably around 10 Pa;

a plasma source power preferably between 3 and 10 kW, more preferably between 3 and 8 kW; and zero substrate bias power or a nominal bias power density of less than 300 W/m$^2$, preferably 30 W/m$^2$ or less.

The bias applied to the substrate could be from a DC power source. However, in preferred examples, during at least one of the control steps constituting the passivation layer removal process sub-phase, preferably the core passivation layer removal step, the one or more devices are instructed to apply an alternating bias voltage to the substrate, the frequency of which is preferably at least 50 kHz. As discussed below, applying a bias frequency (preferably a low or intermittent bias frequency) has benefits in terms of reducing sidewall notching which may otherwise occur at interfaces between semi-conducting (or conducting) and insulating materials within the substrate.

In a particularly preferred implementation, the passivation layer removal process sub-phase comprises a core sequence of control steps by means of which the one or more devices are alternately instructed to implement zero substrate bias power or a nominal bias power of less than 300 W/m$^2$, preferably 30 W/m$^2$ or less, in one control step, and a higher substrate bias power, preferably between 1500 and 8000 W/m$^2$, more preferably between 3000 and 6000 W/m$^2$ in the next control step. The advantages of such an approach are explained below.

It should be noted that bias could be applied to the substrate during steps of the process other than those of the passivation layer removal sub-phase, and in such cases a low or intermitted bias frequency may again be preferred, as discussed further below. For example, it may be advantageous to apply a bias to the substrate during the passivation deposition phase, in order to reduce the amount of passivation material that is deposited on the base surface of the feature to be etched.

Another problem that may be encountered in practical surface processing tools is the differing response times of the various devices which control the conditions within the processing chamber. Typically, mechanical devices such as valves, will take longer to execute a command than devices with no moving parts, such as power supplies. Thus, some operations such as changing the output level of a power supply may take place in only a few tens of milliseconds, whilst small valves may require a few 100 milliseconds to put a command into effect. The result is that the desired set of outputs may not be fully implemented until a significant portion of the control step has elapsed such that the effective duration of the instructed step is inadvertently shortened. This is especially the case where the control steps are of inherently short duration as described above in relation to the first aspect of the invention. To address this, in particularly preferred embodiments, where the one or more devices comprises a plurality of devices, the series of control steps includes one or more transition control steps, in each of which one or a subset of the devices is instructed to effect a change in a corresponding process parameter, the timing of the or each transition control step being related to the known response time of the instructed device(s). In this way, individual devices (or groups of devices) are instructed at different times such that their outputs can be synchronised. For example, a device which is slow to respond may be instructed to change its output in a first transition control step, and then in a second transition control steps, device(s) which are faster to respond will be issued with commands. This ensures that the desired series of control steps are implemented as nearly in synchronism as possible.

Depending on the devices in question, a single transition control step may suffice. However, preferably the series of control steps includes a sequence of transition control steps, according to which individual ones or subsets of the plurality of devices are instructed to effect changes in corresponding process parameters in sequence according to the devices' known response times, whereby the instructed changes to the corresponding process parameters are effected substantially in synchronicity with one another, preferably substantially simultaneously.

The transition control step(s) will advantageously be shorter than the corresponding gas response time(s) of the chamber, but this is not essential.

As already discussed, short control steps are advantageous and in preferred examples, each of the control steps in the series has a duration which is less than the corresponding gas residence time ($T_{gr}$) of the processing chamber for the step.

Any type of substrate could be used in the disclosed methods but advantageously, the substrate comprises a semiconductor layer, preferably on or forming a wafer, e.g. a silicon wafer. If a feature is to be etched into the substrate, the semiconductor layer preferably carries a mask layer thereon (e.g. photoresist), defining the feature to be etched into the semiconductor layer.

In preferred embodiments, the method may further include steps for stopping etching when the feature has reached a desired depth or otherwise defined endpoint. Advantageously, the method further comprises monitoring the substrate as the etching progresses, detecting when the etching has reached a predetermined endpoint, and outputting an endpoint signal. Various actions may be taken in response to the endpoint signal. In one preferred implementation, the method further comprises halting the series of control steps in response to the endpoint signal (e.g. stopping processing entirely) so that no further etching takes place. In some cases the processing may be halted after a preset delay period has elapsed after the endpoint signal is output in order to allow an "over etch".

In other preferred implementations, the outputting of the endpoint signal triggers a change in the applied process. Thus, the method may further comprise starting a second, different, series of control steps in response to the endpoint signal, preferably after a predetermined delay. For instance, the second series of control steps may have process parameters adjusted to achieve a slower etch rate, to minimise damage that may be caused during over etching (such as notching as described below) or to adjust the parameters to focus the etching on regions of the wafer which may not yet have reached the desired depth. The second series of control steps may be performed for a fixed duration and then halted in order to complete processing.

Monitoring of the substrate in order to detect the end point can be performed in various ways. In one preferred embodiment, this comprises monitoring the etching depth (i.e. the depth that the etched feature has reached), preferably using an optical interferometer, and the predetermined endpoint is a predetermined etching depth. In an alternative advantageous embodiment, the monitoring of the substrate comprises monitoring the composition of the material being etched, the substrate comprising a stop layer underlying and of a different composition to the layer to be etched, the endpoint detection signal being output when a change in composition is detected. Thus, rather than supply the controller with a desired depth value, the substrate itself contains a stop layer marking the position at which etching should be stopped. The composition of the material being etched can be sensed by using a spectrometer or filter to view certain wavelengths in the light emitted within the plasma chamber which are indicative of relevant atomic transitions.

In certain applications, the substrate may advantageously further comprise or be provided with an insulating layer overlying or underlying the semiconductor layer. The insulating layer may or may not be an integral part of the substrate. For example, as mentioned above insulating layers such as silicon oxide may be used to stop etching progressing beyond a certain depth. Insulating layers may also be used to isolate semiconductor devices from each other or to form electrically isolated island features. However, as mentioned above, the presence of insulating material in the substrate can lead to the formation of side wall "notches" at the interface between the semiconductor (or conductor) layer and the insulating layer. This is a result of the insulating layer becoming charged during ion bombardment, which can cause subsequent ions to be repelled towards the side walls, leading to undesirable lateral etching.

EP-A-1131847, referenced above, discloses techniques for reducing side wall notching, in which the bias applied to the substrate in order to induce directional ion bombardment is either a low frequency alternating bias, or a (low or high frequency) alternating bias to which a pulse modulation is applied by instructing a local power source to output a signal which is modulated by a pulse generator. U.S. Pat. No. 6,926, 844 describes another system in which high-frequency-pulsed high-frequency power is applied to the substrate and provided with a low-frequency modulation. "Inductively Coupled Pulsed Plasmas . . . " by Banna et al, IEEE Transactions on Plasma Science, Col. 37, No. 9, September 2009, discloses pulsing both the substrate bias and plasma power in synchronicity by using the same pulsed signal generator to modulate the power supply for both components. Such techniques achieve a reduction in the charge on the insulating layer by enabling electrons from the plasma to diffuse down to the insulating layer during the instances when the bias is low or off to thereby neutralise some of the charge. As a result, the repellent force on subsequent ions is also reduced, leading to less deflection and hence reduced notching.

A second aspect of the invention provides a method of etching material from a substrate in a surface processing tool, the substrate comprising a semiconducting or conducting layer provided with an overlying or underlying insulating layer, the surface processing tool comprising a processing chamber, a controller and one or more devices for adjusting the process parameters within the chamber, including a bias power source for applying a bias voltage to the substrate, the method comprising:

the controller alternately instructing the one or more devices to implement etching and passivation process phases, one after another, and, during at least part of at least one of the alternate phases, controlling the power source in a sequence of steps, comprising the controller alternately instructing the power source to output a bias voltage with a relatively low or zero magnitude for the duration of a first step, and then to output a bias voltage with a relatively high magnitude for the duration of a second step, whereby the formation of side wall notches at the interface between the semiconducting or conducting layer and the underlying insulating layer is reduced.

The bias power source can be static (DC) or alternating (RF) and may be a voltage or a current supply. By instructing the bias source in a series of steps during which the output is either to be "on" (high) or "off" (zero or nominal, i.e. close to zero), rather than delegating control of the bias to the bias source itself or a pulsed signal generator, the second aspect of the invention enables detailed control of the bias to be incorporated into the overall control of the tool, put into effect by the controller. The sequence of alternate bias steps can thus be tailored by the controller to achieve the best overall process results. For example, in some cases it is desirable to synchronise the bias steps with changes to at least one other process parameter and so in preferred embodiments, other(s) of the one or more devices are additionally instructed to effect a change in corresponding process parameter(s) between the first and second steps. In other words, the controller instructs a change in at least one other process parameter at the same time as the change in bias. For instance, the plasma power could also be reduced during the steps when the bias is "off".

Direct control of the substrate bias by the controller also makes it possible to apply a more complex series of bias levels. For instance, in conventional systems making use of a pulsed signal generator, the applied bias will simply alternate between a high level and a low level (which may be zero). In preferred embodiments of the invention, the controller instructs the power source to output a bias voltage to the substrate at at least three different magnitudes (one of which may be zero) during one cycle of etching and passivation process phases.

Thus, in some embodiments, it may be desirable to alter the magnitude of the bias output in one or more of the steps (i.e. within one of the process phases). For example, the magnitude of the relatively higher substrate bias power instructed in each second step may advantageously be varied along the sequence of steps, preferably increasing towards the end of the sequence. This assists in improving or maintaining mask selectivity, since the bias can be kept low at the onset of directional ion bombardment, minimising the ions' energy and thus preserving the mask. As the etch proceeds and the charge on the insulating layer increases, the bias is increased which increases the energy of the directional ions, reducing the effect of the charge on their trajectories and hence reducing notching.

In other embodiments, the applied bias may be alternated between two levels during one process phase (etching or passivation) and at least a third, different, bias level, be applied during the other process phase.

In particularly preferred embodiments, at least two different non-zero bias power magnitudes are instructed during the cycle, in addition to a zero or near-zero power level.

In another preferred embodiment, the magnitude of the relatively higher substrate bias power instructed in each second step of the sequence varies from one occurrence of the sequence to the next, i.e. between cycles. Hence, the magnitude of each second step may be constant within any one process phase but be increased or decreased in the next process phase to which bias is applied. For instance, where the sequence of steps takes place during each alternate etching phase, the magnitude may advantageously be increased in the second cycle relative to that applied during the first cycle. Increasing the bias magnitude from cycle to cycle in this way for at least a portion of the overall process assists in improving mask selectivity whilst reducing notching for the same reasons as given above since there will typically be some charge remaining from previous cycles despite the intervening process steps. The magnitude of the bias applied in each second step could also change (e.g. increase) within each cycle, so that for instance there is an increase during each sequence and from cycle to cycle. If a change in magnitude between cycles is implemented, this need not take place between every occurrence of the sequence. For example, the sequence could be repeated several times at one magnitude before a change in magnitude is instructed.

As alluded to above, in some cases it is preferable that the power source is controlled in the sequence of steps during at least part of at least one of the alternate etching phases. However, advantages could also be achieved by executing the sequence during other phases of the process. For example, as already mentioned it may be advantageous to control the bias source in the manner described according to the sequence of steps during the passivation phase. This will reduce the amount of passivation material successfully deposited on the base of the feature to be etched whilst having little effect on the deposition on the side walls due to the directionality imposed by the bias. Overall, the etch efficiency of the process can thus be increased since the duration of the passivation removal phase can be reduced and substrate etching begun earlier. The described sequence of "on/off" bias steps is beneficial during the passivation phase for the same reasons as already discussed since in practice the passivation material will often be an electrical insulator (e.g. a PTFE-like material) forming an overlying layer on the substrate and hence similar charging issues are likely to be encountered as those experienced when etching down to an underlying insulating layer. This could be implemented whether or not the substrate comprises a further insulating layer.

If an RF bias is used, preferably the bias power is an alternating power (voltage or current) with a frequency that provides at least 100 oscillations during each step of the sequence, the frequency preferably being in the range 50 kHz to 27 MHz, more preferably 300 kHz to 13.56 MHz.

Advantageously, at least one (preferably each) of the steps has a duration which is less than the corresponding gas residence time ($T_{gr}$) of the processing chamber for the step. Typically, the corresponding gas residence time of the processing chamber for the step is between 0.1 and 5 seconds, preferably between 0.5 and 2 seconds, still preferably approximately 1 second.

In the first step of the sequence, the bias power source is advantageously instructed to implement zero substrate bias power or a nominal bias power of less than 1500 W/m$^2$, preferably 150 W/m$^2$ or less. In the second step, the relatively high substrate bias power may be between 1500 and 8000 W/m$^2$, more preferably between 3000 and 6000 W/m$^2$.

In particularly preferred embodiments, each of the steps in the sequence has a duration of between 5 and 100 milliseconds, the total duration of the sequence being between 50 and 4000 milliseconds, preferably between 50 and 500 milliseconds, more preferably between 100 and 200 milliseconds. Generally it is preferred that the bias power has relatively long periods of time when it is reduced to zero (or a low value) between shorter periods of time when higher bias is applied (at least during the passivation removal phase of the process). Thus in preferred examples, the duration of the low bias steps is preferably longer than the duration of the high bias steps.

The method may also comprise steps for detecting the etch depth reaching a predetermined endpoint and subsequently halting processing or adjusting the processing parameters such that a new cycle of different alternate etching and passivation steps is performed, as discussed above in relation to the first aspect of the invention.

The invention also provides a computer program product containing commands for controlling a surface processing tool to perform any of the methods described above.

Also provided is a surface processing tool for etching material from and/or depositing material onto a substrate, comprising a processing chamber in which the substrate is placed in use, one or more devices for adjusting the process parameters within the chamber and a controller adapted to control the one or more devices in accordance with any of the methods disclosed above. Preferably, the one or more devices include any of: one or more mass flow controllers, one or more plasma source power supplies, substrate bias power source(s), a pressure control valve and an exhaust pump system.

Examples of etching and/or deposition methods, and apparatus therefor, will now be described with reference to the accompanying drawings, in which:—

FIG. 1 schematically depicts an exemplary surface processing tool adapted to carry out the presently disclosed techniques;

FIG. 3(i) illustrates a series of control steps performed in a method according to a first embodiment of the invention, FIGS. 3(a), (b) and (c) being plots of three selected process parameters, showing exemplary values of each during each control step;

Figure 4A:
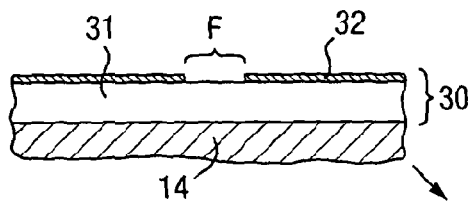
Figure 4B:
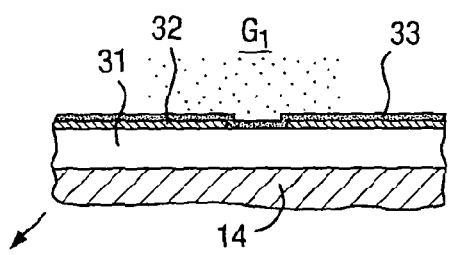
Figure 4C:
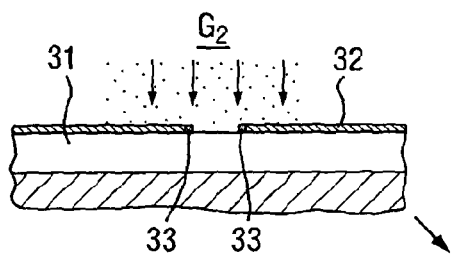
Figure 4D:
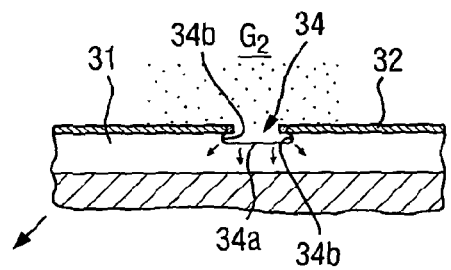
Figure 4E:
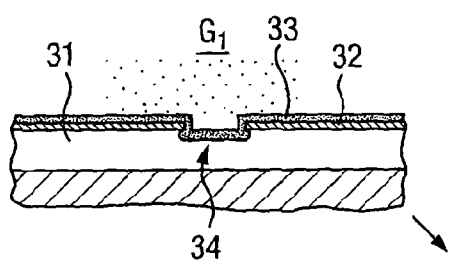
Figure 4F:
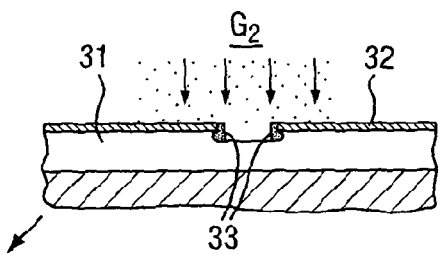
Figure 4G:
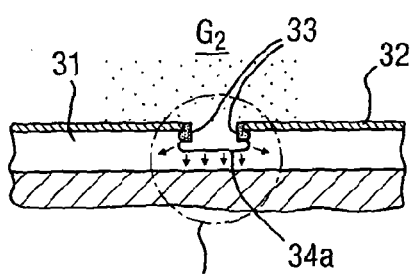
Figure 4H:
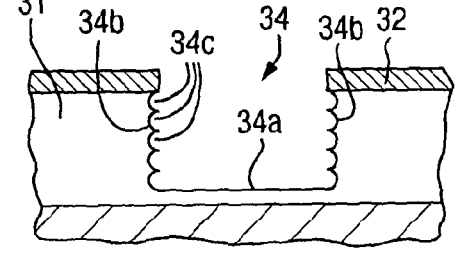
Figure 6I:
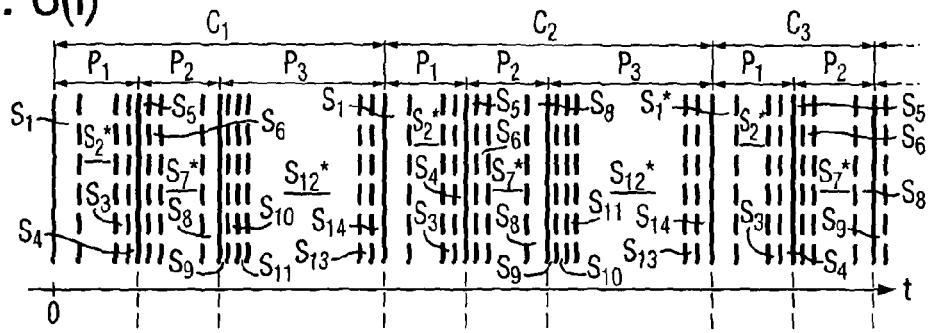
Figure 6A:
Figure 6B:
Figure 6C:
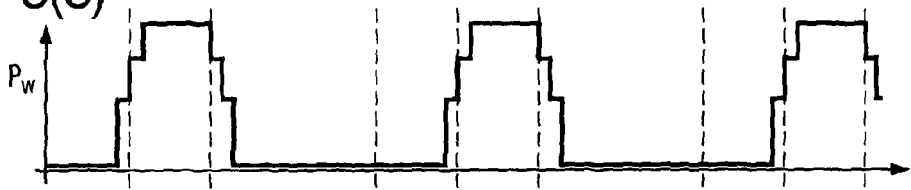
Figure 6D:
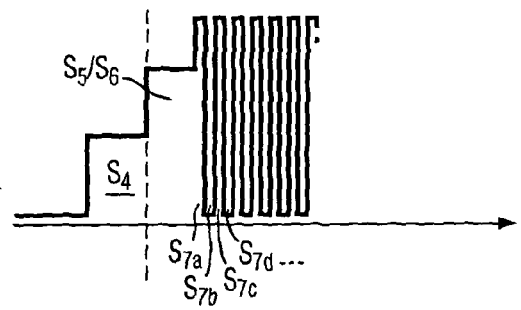
Figure 7I:
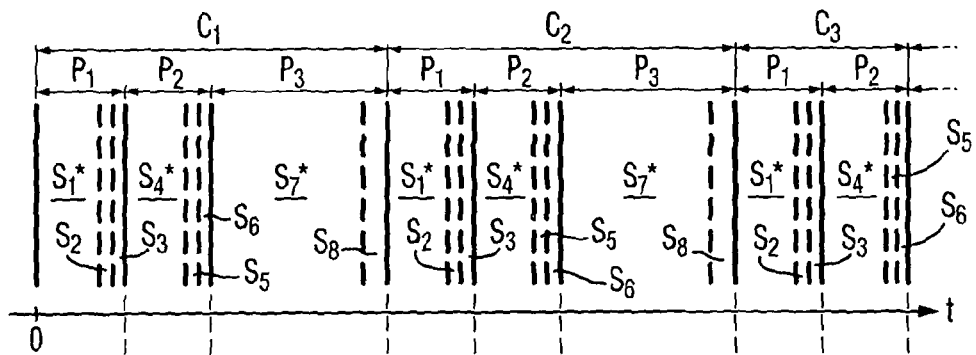
Figure 7A:
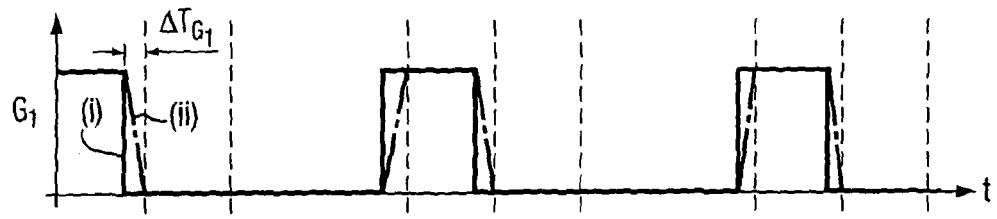
Figure 8A:
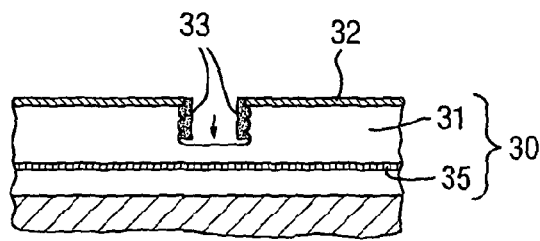
Figure 8B:
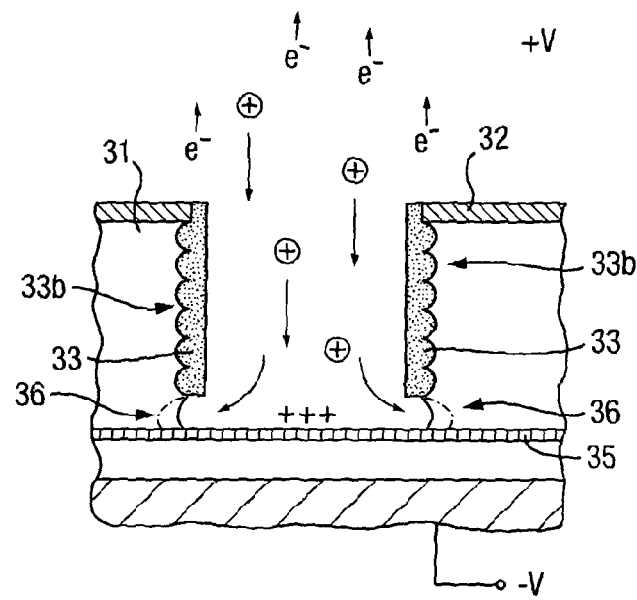
Figure 9:
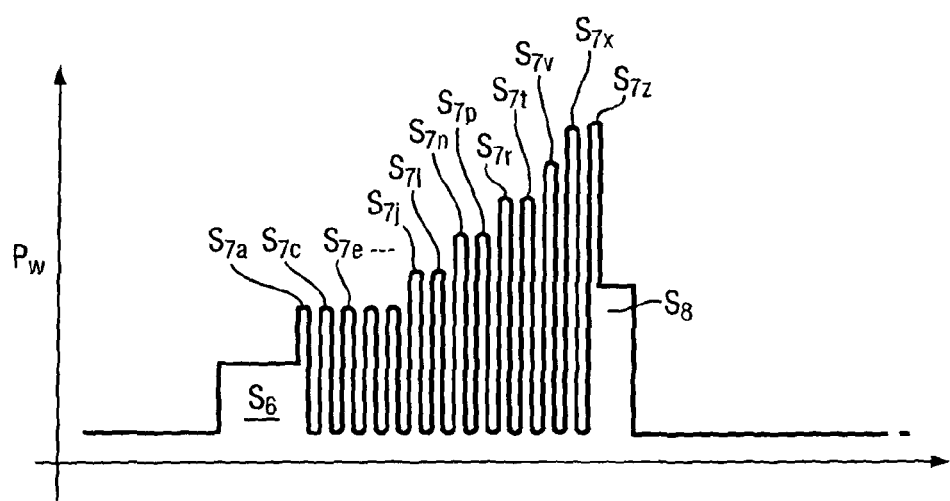
Figure 10A:
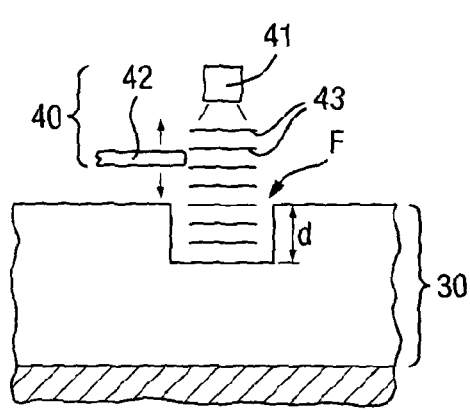
Figure 10B:
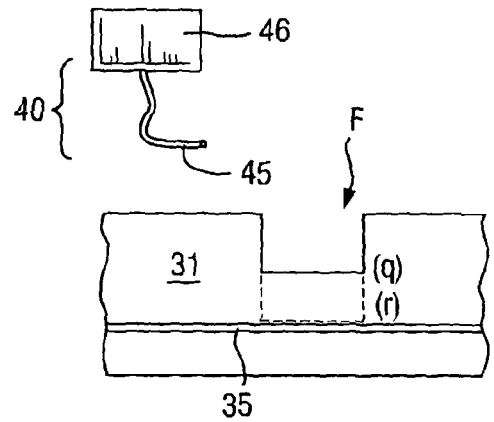
Figure 11:
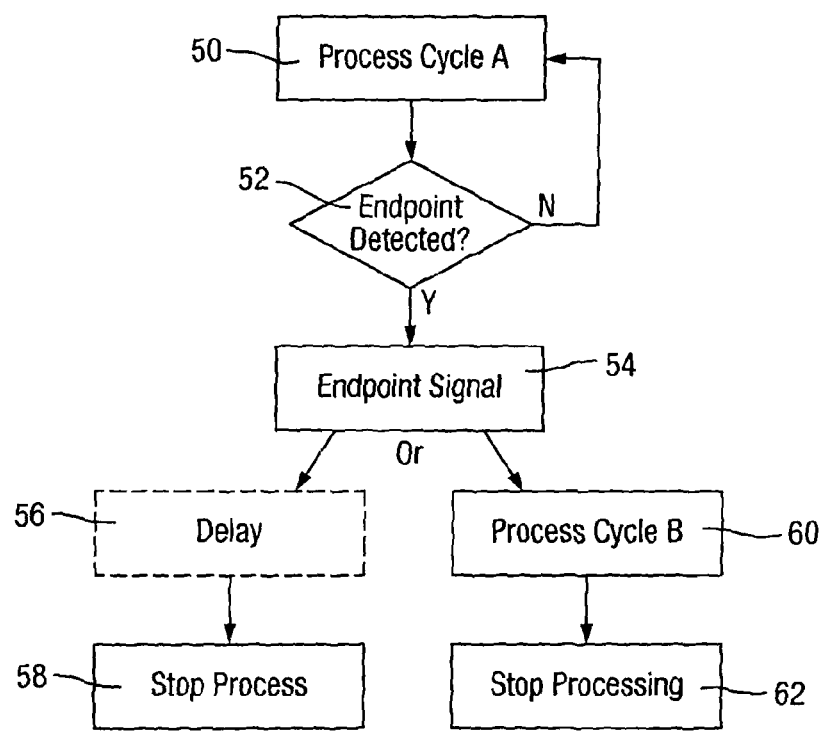

FIGS. 4(a) to 4(g) show an exemplary substrate during selected steps of the first embodiment, FIG. 4(h) showing an enlarged detail of an etched feature formed in accordance with the embodiment;

FIG. 5 illustrates a series of control steps performed in a method according to a second embodiment of the invention;

FIG. 6(i) shows a series of control steps performed in a method according to a third embodiment of the present invention, FIGS. 6(a), (b) and (c) being plots depicting the values of three selected process parameters during each step and FIG. 6(d) showing an enlarged detail of FIG. 6(c);

FIG. 7(i) shows a series of control steps performed in a fourth embodiment of the present invention, FIGS. 7(a), (b) and (c) being plots depicting the values of three selected process parameters during each control step;

FIG. 8(a) schematically depicts a substrate in a fifth embodiment of the invention, FIG. 8(b) showing an enlarged detail thereof, illustrating the phenomenon of "notching";

FIG. 9 is a plot depicting the instructed output power of a substrate bias voltage source in a series of control steps performed in a further embodiment;

FIGS. 10(a) and 10(b) depict two examples of endpoint detection devices which may be used in any of the embodiments; and FIG. 11 is a flow chart illustrating options for controlling the process when the endpoint is detected in any of the embodiments.

The description below will focus on examples of methods for etching features into substrates using alternating etching and passivation steps, in the manner of the Bosch process described above. However, as already indicated, the presently disclosed techniques are not limited to use in any one specific process, but rather can be advantageously applied to any deposition and/or etching procedure which requires multiple steps. An "etching process" is any process whereby the net effect of the instructed process parameters is the removal of material from a substrate (whether that material forms part of the substrate itself or a layer applied thereto), and likewise an "etching step" is one in which the net effect of the instructed process parameters is the removal of material. In contrast, a "deposition process" is one in which the instructed process parameters result in net addition of material to a substrate, and a "deposition step" is one in which the instructed process parameters cause net addition of material. A passivation process/step is an example of a deposition process/step for the purposes of the following description, however in practice the formation of the passivation layer may involve a reaction between the precursor gas(es) and the substrate, e.g. silicon oxyfluoride wall passivation in a cryogenic silicon etch process.

The terms "etching gas" and "passivation gas" are used to refer, respectively, to gases which are capable of etching and passivating at the particular process parameters in question. For instance, some gases such as $C_4F_8$ can etch or deposit, depending on the other process parameters implemented. $SF_6$, on the other hand, is an example of a gas which is only capable of etching.

It should be appreciated that the instructed process parameters may not be identical to those actually established within the process chamber at any one time, due to the chamber having a finite response time, as well as other factors. Wherever "process parameters" are referred to in this disclosure, it should be noted that the references are to the instructed values rather than to the actual conditions within the chamber.

Figure 1:
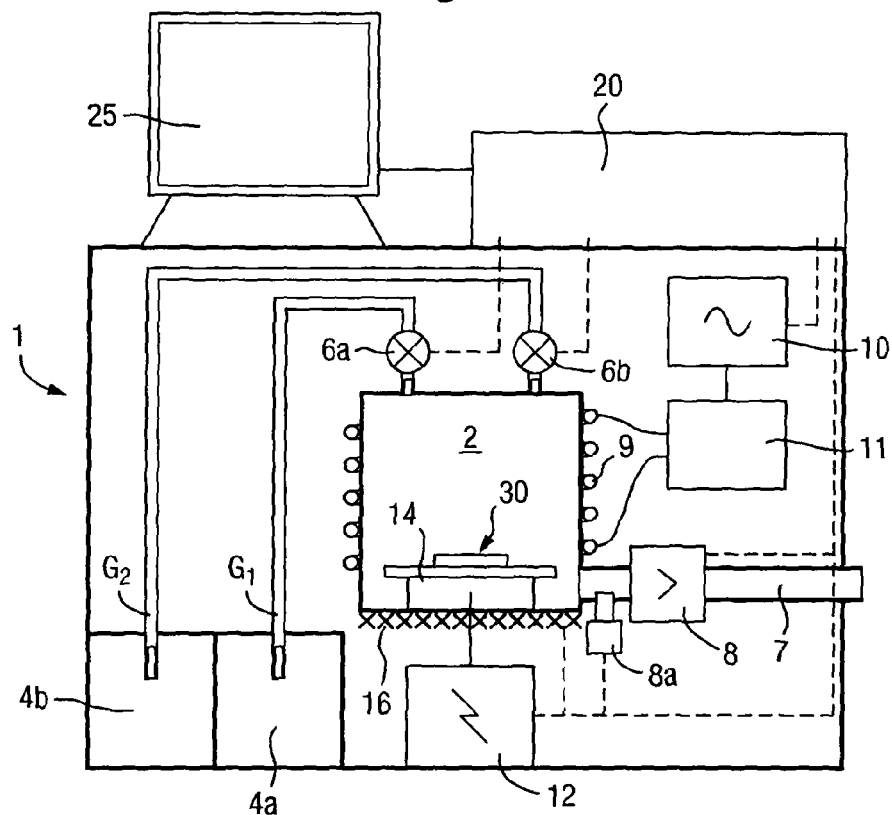

FIG. 1 shows an embodiment of a surface processing tool suitable for implementing the presently disclosed methods. The surface processing tool 1 comprises a process chamber 2 within which a substrate 30 is placed during use. To perform etching or deposition, one or more input gases are introduced to the process chamber 2 and the conditions controlled in order to effect the desired deposition or etching mechanism. The term "input gases" includes precursor gases as well as inert, carrier gases if required. The process parameters within the chamber are controlled and can be adjusted by a set of at least one (but more typically a plurality of) devices 3, of which examples are shown schematically in FIG. 1. In this example, the tool 1 is equipped with two input gas supplies 4(a) and 4(b) for supplying first and second input gases, $G_1$ and $G_2$ respectively, to the process chamber 2. The ingress of each gas to the chamber 2 is controlled by respective mass flow controllers 6(a) and 6(b). These essentially comprise valves which can be opened to a greater or lesser extent depending on the desired flow rate of each gas. The exhaust gas, including unreacted input gases and any reaction products, is removed from process chamber 2 via a duct 7 and associated pump 8, the pump 8 typically being capable of reducing the pressure within the chamber to near-vacuum conditions. The chamber pressure will be determined in the main part by the exhaust pump system and particularly the pumping speed and the "conductance" of the pumping line from the chamber to the pump (this is a factor related to the geometry of the pumping line). However during processing, when a plasma is created and/or when etching or deposition takes place, gaseous species may be lost or created inside the chamber thereby having an effect on the pressure. In order to regulate for such variation, an automatic pressure control valve 8a is preferably provided as known in the art. The valve 8a changes the conductance of the pumping line to thereby enable the chamber pressure to be maintained substantially constant at the desired level as the plasma is struck and the material etched.

In this example, the surface processing tool 1 is equipped with a plasma source for generating a plasma within the process chamber by means of an electrical discharge. Here, the plasma source is depicted as an inductively-coupled plasma source comprising a coil 9 surrounding chamber 2, which is supplied with RF power from power supply 10 via a RF matching unit 11. The RF matching unit 11 is configured to match the plasma impedance to that of the RF supply 10 in order to maximise efficiency of power transfer from the supply to the plasma. An example of a suitable matching unit is disclosed in WO-A-2010/073006. Other types of plasma source such as a capacitively-coupled plasma (CCP) could be used instead. Alternatively, there may be no plasma enhancement of the process and hence the plasma source may be omitted. If a plasma source is provided, it may be utilised during any, all or none of the process steps.

The substrate 30 is mounted in use on a platen 14. As described below, in certain process steps it is advantageous to apply a bias voltage to the substrate 30 and this is achieved by connecting a voltage source 12 to the platen 14. If an RF power supply 12 is used then an Automatic impedance Matching Unit (AMU) may preferably be provided to ensure good coupling of power from the power supply 12 to the wafer table 14. The tool 1 may further comprise a temperature control unit 16 such as a heater and/or cooling system for adjusting the processing temperature of the substrate (additional devices for heating and/or cooling of the process chamber and plasma source may be provided to assist with process control and/or to maintain hardware stability). For instance, where etching is primarily to be carried out, the substrate is preferably cooled using a circulating coolant to prevent the significant amount of energy transferred to the substrate during ion bombardment and/or during exothermic chemical reactions causing an undesirable increase in the substrate temperature.

The devices 3 operate upon instruction from a controller 20, such as a programmable logic controller (PLC) or similar. In some cases, more than one controller can be provided, with each controller controlling one or a subset of the devices. The controller is also connected to a user interface device such as a computer workstation 25 for receiving input from the user and/or returning outputs.

Figure 2:
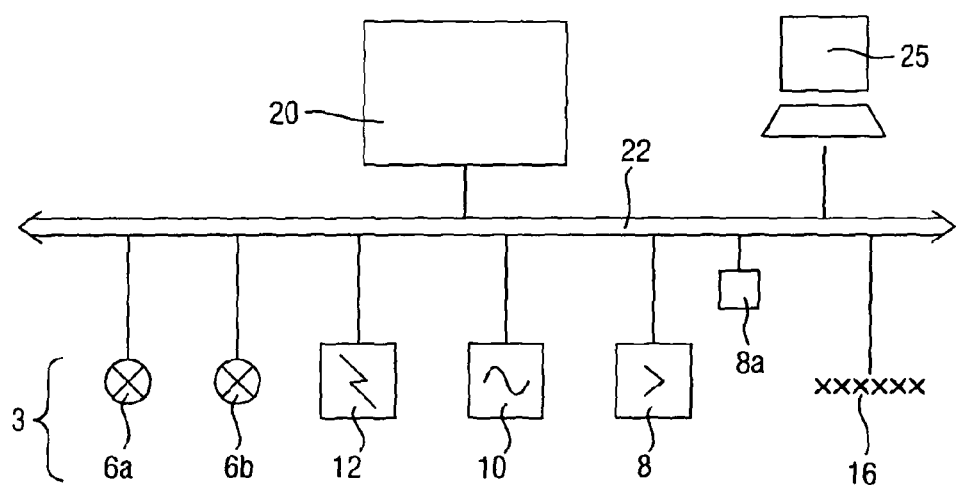
FIG. 2 is a schematic network diagram illustrating data connections between various functional components of the surface processing tool shown in FIG. 1.

In FIG. 1, the data connections between the various devices 3 and the controller 20 are indicated by dashed lines. In practice, this may be implemented as a network as depicted, for example, in FIG. 2. Here, the controller 20 is shown connected to a CANbus bridge 22, which has connections to each of the devices 3 as well as the user interface 25. The bus 22 typically comprises multiple network channels including one or more data channels such as serial data channels (e.g. RS485) and, optionally, one or more power channels. The controller 20 issues commands across the bus 22, each of which is addressed to one or more of the devices and includes instructions as to one or more process parameters the device in question is to implement. An example of a network protocol which could be used for the issuing of commands for the control of the devices is given in WO-A-2010/100425. Of course, many other network implementations are possible as will be appreciated by the skilled person.

The devices 3 are controlled by the controller in a series of control steps, each step corresponding to a defined set of process parameters which the devices 3 are instructed to implement. In practice, multiple commands may be sent by the controller 20 to the devices 3 in order to implement any one step; for example, a first command may be sent to the first mass flow controller 6(*a*), whilst second and subsequent commands are sent to mass controller 6(*b*) and any other devices whose outputs are to be changed in the step. Thus, whilst not all of the commands required to implement a full set of process parameters for any one step may be sent or received simultaneously, in practice the network speed will be fast compared with the step timings and thus the instructions for any one step can be considered to be issued to the devices 3 substantially instantaneously. Alternatively, a technique such as that disclosed in WO-A-2010/100425 can be employed whereby instructions for each device are delivered to an interface module associated with each respective device and held back until a trigger message is issued to all relevant interface modules, at which point the instructions are passed to the respective devices simultaneously.

One defined set of process parameters is considered to be different from another if any one of the process parameters changes in value between the two sets. The process parameters in question will depend upon the process being carried out but typically will include: the flow rate(s) of one or more input gases (e.g. $G_1$ and $G_2$ in the present example), the chamber pressure (controlled by the exhaust pump speed and/or pressure valve setting), the plasma source power and/or frequency, the power and/or frequency of any bias voltage applied to the substrate and the temperature of the wafer table 14 and in many cases the process chamber 2.

FIG. 3(*i*) schematically depicts a series of control steps which are performed according to a first embodiment of an etching/deposition method. Here, the series of steps consists of sequential cycles $C_1$, $C_2$, $C_3$, etc., each of which comprises three control steps $S_1$, $S_2$ and $S_3$. At the start of each control step, the devices 3 are instructed by the controller 20 to implement a defined set of process parameters for the duration of the step. In certain control steps, one or more of the parameter values may be instructed to vary over the duration of the step. However, at least one, preferably all, of the steps in each cycle involves the instruction of constant defined process parameters for the duration of the step.

With reference next to FIG. 4, the function of each control step will be explained. In this example, the process is a modified Bosch-type process for etching a feature into a substrate such as a silicon wafer 30. As shown in FIG. 4(*a*), initially the substrate 30 is placed on platen 14 in the process chamber 2. The substrate comprises a silicon wafer 31 with a mask 32 applied thereon, formed for example of photoresist. The mask 32 defines the lateral extent of the desired feature F which is to be etched into the silicon wafer. In a first step corresponding to control step $S_1$, the substrate is exposed to a passivation gas $G_1$ such as $C_4F_8$, which deposits a layer of passivation material 33 (such as a polymer) across the whole surface of the substrate. Steps $S_2$ and $S_3$ collectively perform etching: by dividing the original Bosch-type etch step into two in this way, mask selectivity is improved. In step $S_2$, an etching gas $G_2$ such as $SF_6$ is introduced into the chamber and directional ion-assisted etching of the deposited passivation material is performed by applying a bias voltage to the platen 14. The bias voltage establishes an electric field which imposes near-vertical directionality on the gas ions, causing preferential bombardment of horizontal surfaces. In this way, passivation material is removed from the base of the feature, exposing the substrate material 31, and also from the upper surface of the mask 32. However, the side walls of the feature to be etched retain passivation coverage 33. In step $S_3$, depicted in FIG. 4(*d*), the etching proceeds by way of chemical reaction between the etching gas $G_2$ and the substrate material 31. For example, where the etching gas $G_2$ is $SF_6$ (or another common etching gas that releases fluorine), fluorine radicals from the plasma chemically react with the exposed silicon, forming a volatile product which desorbs from the surface thereby removing silicon in an isotropic manner. In this way, the base surface 34*a* of the feature 34 increases in depth. However, as the depth increases, new side wall regions 34*b* are formed and the substrate material is removed laterally as well as in the vertical direction (down into the wafer).

FIG. 4(*e*) shows the beginning of cycle $C_2$ in which step $S_1$ is repeated, thereby applying a new layer of passivation material 33. The etching is thus halted and the new side wall regions and base surface of the feature 34 recoated. Subsequent etching as shown in FIGS. 4(*f*) and 4(*g*) removes the passivation material again from only the base surface of the feature, enabling continued downward etching whilst controlling the lateral expansion of the feature. After many repetitions, the result is an etched feature 34 as shown schematically in FIG. 4(*h*), having well-defined near-vertical side walls 34*b* accurately aligned with the masked feature. However, each etching cycle will produce a "scallop" 34*c*, i.e. a recess, in the side wall 34b, the size of which needs to be controlled in order to maintain the positional accuracy of the side walls.

The optimum process parameters for each of the steps $S_1$, $S_2$ and $S_3$ vary widely. Plots (a), (b) and (c) in FIG. 3 depict the values of three exemplary process parameters and illustrate their variation along the series of steps (it should be appreciated that the y-axis on each plot is schematic and not to scale). FIG. 3(a) depicts the flow rate Q of passivation gas $G_1$ into the processing chamber, which will be controlled by mass flow controller 6a. The solid line (i) represents the instructed process parameter value, whilst the dashed line (ii) schematically represents the actual conditions in the chamber which, for reasons explained below, may be quite different to those instructed at any one instant. It should be appreciated that line (ii) is purely schematic and is not intended to accurately represent the chamber conditions but rather to emphasise that they may differ from those instructed.

FIG. 3(b) is a plot showing the same information for the input of etching gas $G_2$.

FIG. 3(c) is a plot showing the power output instructed to be applied to the wafer (i.e. the substrate bias). Generally, since this does not affect the gas conditions, the actual power output will closely mirror that instructed and hence no separate line representing the actual conditions is given.

Thus, in passivation step $S_1$, the corresponding set of process parameters include a high flow rate of the first input gas $G_1$, zero (or nominal) flow rate of the second input gas $G_2$, and zero (or nominal) bias voltage power. In step $S_2$, corresponding to the first portion of etching, the flow rate of the first input gas $G_1$ is reduced to zero (or a nominal value), whilst that of the second input gas $G_2$ is increased and the bias voltage power switched on to ensure a high ion flux to the substrate. In step $S_3$, corresponding to the second portion of etching, the mass flow rate of gas $G_2$ is increased, whilst the substrate bias power is switched off.

It will be appreciated that FIG. 3 only illustrates selected process parameters and in practice additional parameters may be controlled and/or altered from one step to the next. In particular, to achieve a high overall etch rate, it is generally desirable that the passivation step $S_1$ is operated at a relatively low chamber pressure at conditions optimised for uniform deposition of passivation material resulting in a reasonably conformal, even deposition of material on all surfaces of the feature. The choice of chamber pressure can be used to influence the deposition rate and/or adjust the stochiometry of the deposited material. Etching step $S_2$ is preferably performed at a similar or even lower pressure to reduce ion collisions and promote directionality of the ion flux to the silicon wafer. In contrast, etch step $S_3$ is preferably operated at high pressure in order to produce a large number of fluorine radicals and hence a fast etch rate.

Exemplary sets of process parameters for each of the steps are given below in Table 1. It should be noted that the exemplary parameters given here and in all other examples provided herein are suitable for an apparatus capable of processing substrates up to 200 mm in diameter. The skilled reader will appreciate that, for other substrate sizes, the parameters will require appropriate scaling. Where substrate bias powers are given in Watts (i.e. applied power rather than power density), these assume a substrate area of 314 cm$^2$ (e.g. a 200 mm diameter substrate).

TABLE 1

| | | | Process Parameters | | | | | | | | |
|---|---|---|---|---|---|---|---|---|---|---|---|
| Time (ms) | Phase | Step | Duration (mS) | G1 (sccm) | G1 (Pa·m3/s) | G2 (sccm) | G2 (Pa·m3/s) | Pw (W/m$^2$) | Pressure (mTorr) | Pressure (Pa) | Pp (kW) | Tgr (mS) |
| 0 | 1 | 1 | 250 | 200 | 0.338 | 10 | 0.0169 | 30 | 50 | 6.6661 | 1.5 | 845 |
| 500 | 2 | 2 | 300 | 10 | 0.0169 | 200 | 0.338 | 4750 | 25 | 3.33305 | 2 | 423 |
| 1100 | 3 | 3 | 550 | 10 | 0.0169 | 800 | 1.352 | 30 | 130 | 17.3319 | 5 | 570 |

Where: Time refers to the time elapsed from the beginning of step $S_1$; Duration refers to the length of each step; $G_1$ is the mass flow rate of gas $G_1$, $G_2$ is the mass flow rate of gas $G_2$ (the mass flow rate values are given both in units of sccm and Pa·m$^3$/s); $P_w$ is the power density applied to the wafer (i.e. substrate bias), given in terms of power density in order to account for different wafer sizes (for instance, a power density of 30 W/m$^2$ corresponds to approx. 1 W applied to a 200 mm diameter wafer); Pressure refers to the chamber pressure; $P_p$ is the plasma power and $T_{gr}$ is the gas residence time, defined below.

Importantly, as compared with conventional processes, the duration of each control step is very short. For instance, in the example given above, the duration $T_{S1}$ of passivation step $S_1$ is approximately 250 ms whilst the duration $T_{S2}$ of the first etching step $S_2$ is approximately 300 ms, and the duration $T_{S3}$ of the second etching step $S_3$ is approximately 550 ms, making a total cycle time $T_{C1}$ of about 1.1 s. Step durations of this sort are fast compared with the time taken by the processing chamber 2 to respond to the changes in gas conditions. This can be quantified as the "gas residence time", $T_{gr}$, of the processing chamber 2, which for each process step is defined as:

$$T_{gr} = \frac{pV}{Q}$$

where p is the pressure within the chamber 2, V is the volume of the process chamber and Q is the (total) gas flow rate through the chamber.

For typical configurations of plasma source, process chamber and local pumping duct, the volume of the process chamber 2 in this example is approximately 45 liters (0.045 m$^3$). Thus, for the exemplary process parameters given in Table 1, the gas residence time during step $S_1$ will be approximately 850 ms, during $S_2$ approximately 400 ms and during step $S_3$ approximately 600 ms. This is a measure of the time required to replace the volume of gas contained within the process chamber with another, i.e. to reach a steady state at the new process parameters. However, in the present embodiment, the duration of at least one of the control steps, preferably several of the control steps and most preferably each of the control steps is less than the corresponding gas residence time for that control step. Whilst it would be expected that such short steps would have no operative effect, in fact, the inventors have found that very good results can be achieved, despite the processing chamber never reaching steady state conditions. Without wishing to be bound to theory, it is believed that the cyclical variation in the process conditions induced by the sequence of control steps is sufficient to effect the desired cycle of different mechanisms depicted in FIG. 4, despite the individual sets of process parameters not being clearly delineated from one another in terms of the actual conditions established within the chamber.

The recognition that control step durations of less than the gas residence time are effective provides significant benefits. Firstly, the overall cycle time $T_{C1}$ can be significantly reduced as compared with conventional processes. For instance, the exemplary embodiment described above has a cycle duration of 1.1 seconds whereas conventional Bosch process cycles are typically of the order of 10 seconds or more. Reducing the cycle time reduces the lateral extent of the scallops 34c as can be appreciated from an examination of FIG. 4: since the individual chemical etching steps $S_3$ are shorter and the side walls are passivated at more frequent intervals, the extent to which lateral etching is possible will be reduced. The more cycles which are used to create a feature of a certain etching depth, the smaller the individual scallops will be and hence the closer the side walls 34b will approach a smooth surface.

This improvement can also be used to offset an increased etch rate implemented, for example, by increasing the concentration of etching gas introduced to the process chamber during step $S_3$. By decreasing the period of each cycle in the manner described above (or analogously increasing the cycle frequency), the side walls of the feature will be passivated more frequently, thus negating the detrimental effects of a faster etch and therefore enabling the desired etching depth to be achieved in a shorter period of time whilst maintaining positional accuracy of the side walls.

Another benefit is the possibility of improving the efficiency of the etching process. As shown in FIG. 4, it is only during etching step $S_3$ that the substrate material is actually removed and the depth of the feature increased. Steps $S_1$ and $S_2$ are necessary to ensure the lateral accuracy of the feature but do not themselves contribute to increasing the feature's depth. The use of very short passivation and passivation removal steps ($S_1$ and $S_2$) makes it possible to increase the proportion of the cycle time that is available for etching of the substrate material itself (step $S_3$). An example of such an embodiment is shown in FIG. 5 which depicts a series of control steps which may be performed in a second embodiment. Here, the reference numerals correspond to those used in FIG. 3. It will be seen that steps $S_1$ and $S_2$ are significantly shortened such that etching step $S_3$ forms the greatest part of each cycle $C_1$, $C_2$, etc. The etching step $S_3$ is preferably performed for at least 50% of the cycle time, and more preferably around 80%. Table 2 sets out exemplary process parameter sets which may be instructed in each control step alongside the corresponding step durations.

It will be seen that the exemplary process parameter values selected for each step are the same as those in the first embodiment and hence the gas residence time for each step is unchanged: about 850 ms in step $S_1$, 400 ms in step $S_2$ and 600 ms in step $S_3$. Hence, in this example, step $S_1$ and $S_2$ have durations less than the corresponding gas residence times of the processing chamber, whilst the duration of step $S_3$ is longer.

By increasing the proportion of each process cycle during which step $S_3$ is performed, the overall efficiency of the process is increased since etching of the substrate material occurs for a greater proportion of the time. As such, the overall speed of etching the feature can be increased. However, it will be appreciated that the extended duration of step $S_3$ will lead to increased scallop size and hence, to counter this, it is beneficial to further reduce the overall cycle time, applying the principles of the first embodiment in combination with those of the second.

It will be appreciated that the exemplary process parameters given above in the first and second embodiments are purely exemplary and in practice will be varied according to the gas species in use and the feature requirements. For example, the passivation step $S_1$ can be carried out over a range of pressures depending on the profile required on the wafer, typically between about 3 and 12 Pa, preferably around 7 Pa. The gas flow during the same step is typically in the range of 100 to 500 sccm, more preferably between 200 and 300 sccm. Typically, the flow rate will generally be increased when higher pressures are used. In the passivation removal step $S_2$, gas flow will typically be in the region of 200 to 500 sccm, preferably 300 to 400 sccm, and chamber pressure preferably in the region of 1 to 10 Pa, more preferably around 3 Pa. In the substrate etch step $S_3$, the pressure will be generally between 7 and 30 Pa, preferably around 10 Pa but the gas flow rates may vary typically between 600 and 1000 sccm depending on requirements. Preferred selections of parameters generally give a gas residence time for each step of around 2 seconds or less and, in more preferred embodiments, the parameters are selected to give gas residence times of 1 second or less, on average.

As shown above, the optimum process parameters for each successive process step are markedly different. For example, between the steps $S_1$ and $S_2$, the flow of first gas $G_1$ must be halted and replaced with a similar flow rate of the second input gas $G_2$, whilst between the steps $S_2$ and $S_3$, the flow rate of gas $G_2$ increases by a factor of 3 or more. Similarly, there are wide changes in the chamber pressure and also in the power levels applied to the wafer or other substrate ($P_w$) and the plasma source ($P_p$).

In practice, sudden changes in the process conditions of this magnitude give rise to a number of difficulties. For instance, sudden transitions from one gas type to another can destabilise the plasma, potentially causing it to be extinguished. Similarly, a sudden large change in pressure or gas flow rate even when the gas type is not changed can have destabilising effects. In addition, changes in the process parameters will cause the plasma impedance to change and, if this change is too abrupt, RF matching systems such as module 11 may not be sufficiently fast to follow the change,

TABLE 2

| | | | | Process Parameters | | | | | | | | |
|---|---|---|---|---|---|---|---|---|---|---|---|---|
| Time (ms) | Phase | Step | Duration (mS) | G1 (sccm) | G1 (Pa · m3/s) | G2 (sccm) | G2 (Pa · m3/s) | Pw (W/m$^2$) | Pressure (mTorr) | Pressure (Pa) | Pp (kW) | Tgr (mS) |
| 0 | 1 | 1 | 125 | 200 | 0.338 | 10 | 0.0169 | 30 | 50 | 6.6661 | 1.5 | 845 |
| 250 | 2 | 2 | 150 | 10 | 0.0169 | 200 | 0.338 | 4750 | 25 | 3.33305 | 2 | 423 |
| 550 | 3 | 3 | 825 | 10 | 0.0169 | 800 | 1.352 | 30 | 130 | 17.3319 | 5 | 570 | leading to poor power transmission. This is because RF matching systems typically involve one or more mechanical components which are relatively slow to respond. Sudden large changes in gas flow (e.g. changing from one input gas to another, or significantly changing the flow rate of one gas) can also cause the pressure control valve 8a to "overshoot" its appropriate position, leading to poor pressure control, which can disrupt the processing whether or not it is plasma-enhanced.

Problems such as these are addressed in a third embodiment of the invention, depicted in FIG. 6. Again, the techniques will be described with reference to a modified Bosch-type etching process, but could be applied to any deposition or etching process requiring multiple steps.

FIG. 6(i) illustrates a series of control steps to be performed by a surface processing tool such as that shown in FIG. 1. As before, each control step $S_1$, $S_2$, $S_3$ etc, is associated with a defined set of process parameters which the controller 20 instructs the set of devices 3 to output for the duration of the step. Again, there are three main parts to the process, forming a cycle which is repeated: a passivation process phase $P_1$, and an etching process phase comprising a passivation layer removal process sub-phase $P_2$ and a substrate etch process sub-phase $P_3$. These correspond broadly to the three sequential control steps $S_1$, $S_2$ and $S_3$ described in embodiments one and two. However, in the present embodiment, each process phase (or sub-phase) is made up of more than one control step. In FIG. 6(i) the process phases and sub-phases are delineated from one another using solid lines, whilst the control steps contained with any one process phase or sub-phase are bounded with broken lines. However, in practice, there will be no such distinction between the control steps at the end or beginning of any one process phase and those at any other point during the series of steps: this notation is merely used for clarity.

FIGS. 6(a), (b) and (c) depict the values of three exemplary process parameters and show their variation from one control step to the next, in terms of the instructions issued by the controller to the set of devices (the actual conditions within the process chamber are not represented, for clarity). As before, the three parts (a), (b) and (c) depict the gas flow rate of first gas $G_1$, the gas flow rate of a second input gas $G_2$ and the power level applied to the substrate, $P_w$, respectively. It will be seen that the sequence of control steps now includes a plurality of intermediate control steps in order to achieve gradual transitions between the extreme parameter values required for the different processing phases.

The control step within each process phase or sub-phase which corresponds most closely to the "optimum" processing conditions for the desired output effect can be referred to as the "core" control step for that process phase or sub-phase. For example, in the present embodiment, passivation process phase $P_1$ includes core passivation step $S_2$, which is highlighted with an asterisk in FIG. 6 to denote its status as a core control step. During step $S_2$, the devices are instructed to output a maximum gas flow rate of passivation gas $G_1$, a minimum or zero gas flow rate of etching gas $G_2$, and zero or nominal wafer bias. In order to effect a gradual transition into the passivation removal process sub-phase $P_2$, the end of passivation process phase $P_1$ includes two intermediate control steps $S_3$ and $S_4$ during which the mass flow rate of passivation gas $G_1$ is reduced whilst that of etching gas $G_2$ is increased until the desired passivation removal conditions are achieved in core passivation removal step $S_7$.

In each of the intermediate control steps, the defined set of process parameters output from the controller to the set of devices 3 lies in between those of the preceding and subsequent steps. For example, in step $S_3$, the instructed mass flow rate of passivation gas $G_1$ is less than that in the preceding step $S_2$ but greater than that in the subsequent intermediate control step $S_4$, whilst the mass flow rate of etching gas $G_2$ is greater than that in the preceding step $S_2$ and less than that in the subsequent step $S_4$. It should be noted that it is not necessary for every process parameter to change to an intermediate value for the step to constitute an intermediate control step; rather, any one or more of the process parameters will change to an intermediate value. However, where there is to be a change in gas type (e.g. from passivation gas $G_1$ to etching gas $G_2$), typically in at least one intermediate control step the mass flows of both gases will be intermediate relative to the preceding and subsequent steps, such that both gases are instructed to flow for the duration of the step. For example, during the intermediate step, the gas mixture may have a ratio of the first species (e.g. $G_1$) to the second species (e.g. $G_2$) of between 1:10 to 10:1, by partial pressure, preferably between 1:3 to 3:1, more preferably between 1:2 to 2:1, most preferably around 1:1. This should be contrasted with preferred gas inputs during the core processing steps, during which the necessary etching or passivating gas is heavily dominant (e.g. a ratio of more than 10:1, more preferably around 100:1, of the dominant gas to any secondary gas).

The use of one or more intermediate control steps in this way can be used to control the transition from one extreme set of process parameters to another over a finite time frame, thereby assisting in maintaining plasma stability and ensuring the transition takes place at a rate at which slower components such as the RF matching system can follow.

Whilst in the FIG. 6 example, multiple intermediate control steps are inserted between each adjacent pair of core control steps (e.g. between steps $S_2$ and $S_7$, between steps $S_7$ and $S_{12}$ and between steps $S_{12}$ and $S_2$ in the next cycle), in practice even a single transition step between two different process steps can be beneficial. Further, intermediate control steps need not be disposed in every transition between process phases, but generally at least one intermediate process step is used in each cycle.

In the example given above, the control steps are attributed to each process phase $P_1$, $P_2$ and $P_3$ according to the net effect of the instructed process parameters in each step: if there is no net effect, the control step can be considered part of either adjacent process phase or to form another, intermediate, process phase.

In the third embodiment, the control steps can be implemented with durations longer or shorter than the corresponding gas residence time of the processing chamber. However, the use of short control steps with durations less than the corresponding gas residence time is preferred for all the reasons discussed in relation to the first and second embodiments. In particular, at least one of the intermediate control steps preferably has a duration of less than the corresponding gas residence time of the chamber, more preferably each of the intermediate control steps shares this condition.

Table 3 below sets out exemplary values for the process parameters in each of the 14 steps depicted in the third embodiment, and corresponding gas residence times ($T_{gr}$).

TABLE 3

| Time (ms) | Phase | Step | Duration (mS) | G1 (sccm) | G1 (Pa · m3/s) | G2 (sccm) | G2 (Pa · m3/s) | Pw (W/m$^2$) | Pressure (mTorr) | Pressure (Pa) | Pp (kW) | Tgr (mS) |
|---|---|---|---|---|---|---|---|---|---|---|---|---|
| 0 | 1 | 1 | 10 | 150 | 0.2535 | 50 | 0.0845 | 30 | 60 | 7.99932 | 2 | 1065 |
| 10 | | 2* | 235 | 200 | 0.338 | 10 | 0.0169 | 30 | 50 | 6.6661 | 1.5 | 845 |
| 245 | | 3 | 5 | 175 | 0.29575 | 50 | 0.0845 | 30 | 50 | 6.6661 | 1.5 | 789 |
| 250 | | 4 | 5 | 125 | 0.21125 | 100 | 0.169 | 2375 | 45 | 5.99949 | 1.5 | 710 |
| 255 | 2 | 5 | 5 | 75 | 0.12675 | 150 | 0.2535 | 3950 | 35 | 4.66627 | 2 | 552 |
| 260 | | 6 | 5 | 10 | 0.0169 | 200 | 0.338 | 4750 | 30 | 3.99966 | 2 | 507 |
| 265 | | 7* | 250 | 10 | 0.0169 | 200 | 0.338 | 4750 | 25 | 3.33305 | 2 | 423 |
| 515 | | 8 | 40 | 10 | 0.0169 | 400 | 0.676 | 4750 | 30 | 3.99966 | 2 | 260 |
| 555 | 3 | 9 | 5 | 10 | 0.0169 | 500 | 0.845 | 3950 | 50 | 6.6661 | 3 | 348 |
| 560 | | 10 | 5 | 10 | 0.0169 | 600 | 1.014 | 2375 | 80 | 10.6658 | 4 | 466 |
| 565 | | 11 | 10 | 10 | 0.0169 | 700 | 1.183 | 30 | 100 | 13.3322 | 5 | 500 |
| 575 | | 12* | 500 | 10 | 0.0169 | 800 | 1.352 | 30 | 130 | 17.3319 | 5 | 570 |
| 1075 | | 13 | 15 | 50 | 0.0845 | 500 | 0.845 | 30 | 100 | 13.3322 | 4 | 645 |
| 1090 | | 14 | 10 | 100 | 0.169 | 150 | 0.2535 | 30 | 80 | 10.6658 | 3 | 1136 |

As will be discussed in more detail below with reference to FIGS. 8 and 9, in further preferred embodiments, the passivation layer removal process phase P$_2$ may advantageously be sub-divided into yet more control steps, not shown in FIG. 6(i). FIG. 6(d) illustrates an enlarged region of FIG. 6(c) in which the core passivation layer removal step S$_7$ is formed of a sequence of very short control steps (e.g. 5 ms or less), in which the power applied to the wafer is alternated between zero (or a nominal value) and a higher value sufficient to effect directional ion etching. Controlling the power to alternate between high and low levels in this way reduces the build up of charge on insulating layers within the substrate, thereby reducing notching as will be discussed below. Each individual step S$_{7a}$, S$_{7b}$, S$_{7c}$, etc, is instructed by the controller in the same way as the other control steps already discussed.

Another beneficial application of short control steps in a deposition and/or etching process will now be described with reference to FIG. 7. FIG. 7(i) depicts a series of control steps which are cyclically performed in a fourth embodiment of the invention. Again, a modified Bosch-type etching process is used by way of example. As in the FIG. 6 embodiment, each cycle is divided into three parts, corresponding to the passivation process phase P$_1$, passivation layer removal process sub-phase P$_2$ and substrate etch process sub-phase P$_3$.

Each process phase/sub-phase includes a plurality of control steps S$_1$ to S$_8$. The control steps highlighted with asterisks again represent the core control steps during which the instructed conditions are optimised for implementing the desired process mechanism. Thus, S$_1$ is the core passivation step, S$_4$ is the core passivation layer removal step and S$_7$ is the core substrate etch step. Here, the intervening control steps between core steps are not used to effect a gradual transition from one set of conditions to another, but rather to take account of delays caused by hardware response times.

In practical surface processing tools, different devices in the apparatus will require different periods of time in order to perform the required function. For instance, a mechanical device such as a valve (included for example in mass flow controllers 6a and 6b) may be required to open to its specified level from closed or near closed, or to adopt a closed configuration from open. A finite period of time will be required for the mechanical device to perform the necessary change. Where the device is a power supply (either DC or RF), a certain amount of time will be required to turn on the output and set to a chosen level from the off state, or vice versa. However, typically the time required will be less than that required by any mechanical device. The variation in response time from one device to another means that, despite the controller issuing instructions to the set of devices to adopt a certain set of process parameters substantially instantaneously, in practice, not all of the changes will be output by the devices at the same time. This means that the desired set of process parameters will not be adopted by the devices until a relatively late stage in any one process step, such that the period of time during which all the desired outputs coincide may be shorter than intended.

Figure 7B:
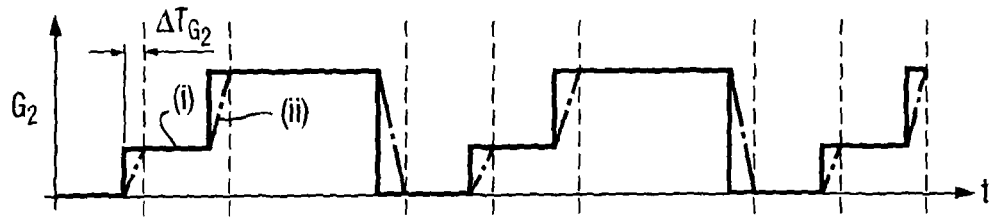
Figure 7C:
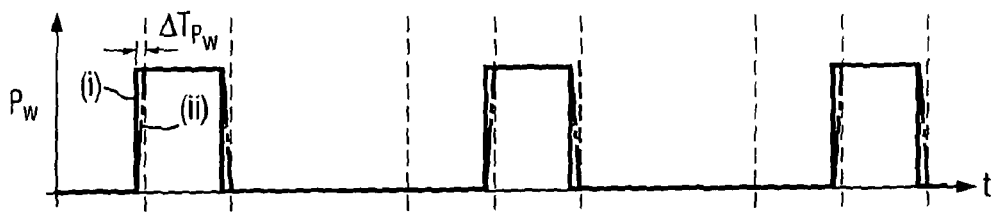

In the present embodiment, this is dealt with by making use of short transitional control steps in order to issue instructions to individual devices (or subsets thereof) at different times depending on the known response times of the devices. For instance, devices which are slower to respond can be instructed to adopt a new output value during an earlier control step than those with faster response times. As an example, FIGS. 7(a), (b) and (c) are plots of three process parameters and their instructed values during the depicted series of steps. FIG. 7(a) shows the instructed value of the mass flow rate of passivation gas G$_1$ (solid line marked (i)), with the dashed line marked (ii) representing the delayed response to the instruction by mass flow controller 6a. Similarly, FIG. 7(b) shows the instructed mass flow rate of the etching gas G$_2$ (solid line (i)), and a representation of the actual response (dashed line (ii)). FIG. 7(c) depicts the instructed wafer bias power (solid line (i)) and a representation of the actual output (dashed line (ii)). It should be noted that the dashed lines in FIGS. 7(a), (b) and (c) do not represent the overall conditions in the process chamber (discussed above in respect to FIG. 3), but rather the response of the respective device.

In the core passivation step S$_1$, the mass flow rate of passivation gas G$_1$ is at its optimal, maximum level for passivation, whilst the flow rate of etching gas G$_2$ is zero (or a nominal value), and there is no wafer bias applied. In control step S$_2$, the controller instructs the mass flow controllers to switch off the input of the passivation gas G$_1$ and switch on the input of etching gas G$_2$ to a first level suitable for passivation removal. The duration of step S$_2$ is based upon knowledge of the response times of the mass flow controllers, $\Delta T_{G1}$ and $\Delta T_{G2}$ and the step is initiated at an instant such that the desired output from each mass flow controller will be achieved to coincide with the start of core passivation layer removal step S$_4$. Meanwhile, in transition control step S$_3$, the instructions to the mass flow controllers are unchanged whilst the power source for supplying power to the substrate is switched on. Again, the duration of the step S$_3$ is selected based on knowledge of the response time of the power source, $\Delta T_{Pw}$, which will typically be much shorter than that of the mass flow controllers. The step $S_3$ is initiated at an instant selected such that the desired power output will be achieved to coincide with the desired gas outputs, i.e. the start of step $S_4$.

Similar transition steps can be effected throughout the rest of the cycle as necessary. For example, towards the end of the passivation layer removal sub-phase $P_2$, a first transition control step $S_5$ is implemented to initiate a change in gas flow rates of etching gas $G_2$ from the passivation layer removal level to a substrate etching level, and in step $S_6$, the substrate bias power source is switched off such that the desired outputs are achieved simultaneously at the beginning of substrate etch step $S_7$. Likewise, towards the end of substrate etch process sub-phase $P_3$, a transition control step $S_8$ is effected to switch off the input of etching gas $G_2$ and switch on input of passivation gas $G_1$.

Generally, the or each transition control step will have a duration shorter than the gas residence time of the chamber with the corresponding processing conditions. For instance, some operations such as changing the output level of the power supply may require a few tens of milliseconds whilst small valves may operate in a few hundreds of milliseconds. In both cases, such durations will typically be significantly less than the gas residence time of around 1 or 2 seconds.

Table 4 below sets out exemplary values for the process parameters in each of the 14 steps depicted in the fourth embodiment, and corresponding gas residence times ($T_{gr}$).

as the insulating layer 35 is exposed, the first ions from the plasma to reach the insulator during the directional ion etching passivation layer removal step can cause it to become charged. This leads to deflection of the following ions (which will have the same charge sign) towards the side walls of the feature, which can result in local removal of the deposited passiviation material 33, exposing the substrate material (e.g. silicon) which is then subject to chemical etching. This results in an undesirable "notch" (labelled 36 in FIG. 8(b)) in the side walls.

The charge build-up on the insulating layer 35, and hence the degree of notching, can be reduced by reducing the level of bias applied to the substrate (labelled –V in FIG. 8(b)). However, this also reduces the degree of directionality imposed on the etching process and the energy with which the ions bombard the substrate. In some conventional processes such as that disclosed in EP-A-1131847 and U.S. Pat. No. 6,926,844, it has been shown that if the applied bias is a low frequency or preferably pulsed bias, the level of charge build up on the insulating layer 35 can be reduced whilst still achieving adequate etching. This is because during the intervals of the alternating bias when the voltage on the substrate is zero (or close to zero) some electrons from the plasma are able to reach the insulating layer 35 and cancel some of the positive charge. In other approaches, a high frequency bias is applied to the wafer table which is then modulated at a lower frequency to create pulses of high frequency bias under the

TABLE 4

| | | | Process Parameters | | | | | | | | |
|---|---|---|---|---|---|---|---|---|---|---|---|
| Time (ms) | Phase | Step | Duration (mS) | G1 (sccm) | G1 (Pa·m3/s) | G2 (sccm) | G2 (Pa·m3/s) | Pw (W/m²) | Pressure (mTorr) | Pressure (Pa) | Pp (kW) | Tgr (mS) |
| 0 | 1 | 1 | 225 | 200 | 0.338 | 10 | 0.0169 | 30 | 50 | 6.6661 | 1.5 | 845 |
| 225 | | 2 | 20 | 10 | 0.0169 | 200 | 0.338 | 30 | 50 | 6.6661 | 1.5 | 845 |
| 245 | | 3 | 5 | 10 | 0.0169 | 200 | 0.338 | 4750 | 50 | 6.6661 | 1.5 | 845 |
| 250 | 2 | 4 | 275 | 10 | 0.0169 | 200 | 0.338 | 4750 | 25 | 3.33305 | 2 | 423 |
| 525 | | 5 | 20 | 10 | 0.0169 | 800 | 1.352 | 4750 | 25 | 3.33305 | 2 | 110 |
| 545 | | 6 | 5 | 10 | 0.0169 | 800 | 1.352 | 30 | 25 | 3.33305 | 2 | 110 |
| 550 | 3 | 7 | 525 | 10 | 0.0169 | 800 | 1.352 | 30 | 130 | 17.3319 | 5 | 570 |
| 1075 | | 8 | 25 | 200 | 0.338 | 10 | 0.0169 | 30 | 130 | 17.3319 | 5 | 2198 |

In the most preferred implementations, the principles of the FIGS. 6 and 7 embodiments will be used in combination with one another. That is, the intermediate control steps will additionally be configured to take into account delays in the response time of each device to thereby achieve additional benefits as described above.

As mentioned above, certain additional problems can be encountered when etching substrates which include insulating layers. In particular, when etching through a conductor or semi-conductor layer such as silicon down to an insulating stop layer such as a buried oxide layer, lateral "notches" can be formed at the interface between the two materials. FIGS. 8(a) and 8(b) schematically illustrate the mechanism behind this phenomenon. FIG. 8(a) shows an exemplary substrate 30 comprising, for example, a silicon or other semi-conductive layer 31 having an underlying insulating layer 35, such as silicon oxide. A feature is etched into the semi-conductor layer 31 in the manner described above. When the etching reaches the insulating layer 35, the process cannot generally be stopped immediately since in other areas of the wafer the insulating layer may not yet have been reached (due to a variation in etch rate across the wafer and/or varying thickness of the layer to be etched). A degree of "over etch" is thus required to counter this variation across the wafer. However, control of the power source. The frequency of the bias is too fast for the plasma to respond and hence the alternating nature of the bias itself does not achieve a reduction in charge build up. However, the lower frequency pulsing provides the opportunity for some electrons from the plasma to reach the insulating layer and cancel some of the positive charge in the same way as described above.

In a further embodiment of the present invention, the sequence of control steps according to which the set of devices is instructed by controller 20 is adapted to reduce the occurrence of such interface notches. In particular, during the passivation removal process phase, a sequence of control steps will be performed as depicted in FIG. 6(d) as steps $S_{7A}$, $S_{7B}$, $S_{7C}$, etc. During alternate steps, the wafer bias is switched between a zero or nominal value (e.g. 30 W/m²) and a higher "on" value sufficient to achieve the desired degree of directionality (e.g. 4750 W/m²). In each control step in which the wafer bias is "on", the bias attracts ions, so achieving directionality and removing deposited polymer from the base of the feature, whilst in the alternating periods of time during which no or nominal bias is applied, electrons can diffuse down to cancel positive charge on the insulating layer. In contrast to previous methods, here the control of the wafer bias is achieved by controller 20 rather than by the frequency to which the power source is set or any local pulse modulation of the power source. This enables a higher degree of control and makes it possible to synchronise the individual steps with changes to other process parameters if desired. For example, in some embodiments, it may be desirable to synchronise the alternating wafer bias levels with changes to the plasma source power.

Any of the process steps in which substrate bias is applied could be performed using a sequence of "on" and "off" steps in the manner described above. For instance, whilst in FIG. 6(d) steps $S_4$ and $S_{5/6}$ are depicted has having constant power applied to the substrate, in practice these may be implemented as several "on"/"off" steps in order to prevent a build up of charge. However, if the steps are sufficiently short, this may be unnecessary.

In FIG. 6(d), the "on" and "off" steps are illustrated as having a substantially equal duration (i.e. a "mark:space" ratio of 50%). However, in practice it is often preferred to provide a longer gap between "on" steps in order to allow more time for neutralising the built-up charge. Hence, preferably, the mark:space ratio is between 5 and 20%. For instance, the bias on time may be 5 ms (e.g. step $S_{7A}$) and the bias off time may be 50 ms (e.g. step $S_{7B}$), giving a mark:space ratio of 10%. Generally it is preferred that the bias power has relatively long periods of time when it is reduced to zero (or a low value) between shorter periods of time when higher bias is applied (at least during the passivation removal phase of the process).

Typically the duration of each of the steps in the sequence $S_{7A}$ to $S_{7Z}$ will be between 1 and 100 milliseconds: short enough to neutralise charge build up at frequent intervals whilst long enough to allow the plasma to respond. The bias applied during each "on" step may be a DC or RF bias. In the case of an RF (alternating) bias, the frequency of the bias will typically be fast compared to the step durations (e.g. 13.56 Megahertz).

The higher degree of control available also makes it possible to select and apply multiple different bias levels and in preferred examples, at least three different bias levels are applied during each passivation/etching cycle (one of which may be zero).

For example, in another embodiment, further benefits may be achieved if the magnitude of the wafer bias is varied during the passivation layer removal process. One example of such an implementation is depicted in FIG. 9, which shows exemplary wafer bias power across another series of control steps $S_{7A}$ to $S_{7Z}$ which collectively form the core passivation removal layer step $S_7$. In this example, the wafer bias power is alternated between a zero or nominal value and a higher "on" magnitude which is increased towards the end of the passivation layer removal process. For instance, in this example, the first step $S_{7A}$ and the subsequent four control steps during which the wafer bias is "on" are set at a first level whilst the magnitudes of steps $S_{7J}$ to $S_{7Z}$ increase. For example, steps $S_{7A}$, $S_{7C}$, $S_{7E}$, etc, may have a wafer bias power of around 1600 W/m² whilst those of steps $S_{7X}$ and $S_{7Z}$ may have power of approximately 4750 W/m². Such a configuration has benefits in terms of improving the mask selectivity of the process, since throughout the majority of the passivation layer removal step, the bias power is relatively low which keeps the energy with which the ions are drawn towards the substrate relatively low, thereby reducing the likelihood that any mask material will be removed in addition to the passivation layer. As the directional etching continues, positive charge will begin to build up on the insulating layer 35 as described above and at this stage it is necessary to increase the energy of the ions by increasing the wafer bias power as shown. This increases the downward velocity of the ions reducing the effect of the charge build up since a greater charge will be required to deflect the ions from their otherwise straight path.

Similar benefits may be achieved by varying the magnitude of the bias on steps between cycles in addition to or instead of within any one process phase. For example, referring to FIG. 6, the sequence of steps making up step $S_7$ in cycle $C_2$ may have a different, higher magnitude than those making up step $S_7$ in cycle and so on. By increasing the bias magnitude as the process progresses in this way, the mask selectivity can be improved for the same reasons explained above, since generally some charge will remain on the insulating layer between cycles irrespective of the intervening passivation phases.

In another embodiment, step sequences such as those shown in FIGS. 6(d) and 9 could alternatively be utilised during other processing phases and on substrates with or without underlying insulating layers. For example, it can be beneficial to the overall etch efficiency of the process if a bias power is applied to the substrate during the passivation phase. This induces directional ion bombardment whilst the passivation material is being deposited, leading to reduced deposition on horizontal surfaces including the base of the feature to be etched. As a result, the thickness of the passivation layer is less at the base of the feature, allowing for a reduced duration of the passivation removal step and earlier instigation of the substrate etch process phase.

Typical passivation materials (e.g. PTFE or similar) however are insulators and so when bombarded with charged ions, will give rise to deflection and potential side-wall notching for the same reasons mentioned above, the passivation layer being effectively an overlying insulating layer. Hence applying the bias in a step-wise fashion is advantageous since it allows for some neutralisation of the charge on the passivation material and thus reduced notching.

In any of the above described embodiments, it is advantageous to control the process such that etching stops at the desired depth. This could be achieved by performing the process for a pre-determined period of time and then stopping. However this will generally not produce a sufficiently accurate result. Hence in a further preferred embodiment, the apparatus is provided with an endpoint detection device for sensing when the etching depth has reached a desired endpoint. This may be defined in terms of a depth from the wafer surface or may be associated with a physical feature of the wafer, e.g. a stop layer underlying the layer to be etched such as insulating layer 35 discussed above.

FIGS. 10a and 10b illustrate two exemplary endpoint detection devices 40. In FIG. 10a, the depth of the etched feature F is sensed and monitored by an optical interferometer comprising an electromagnetic radiation (e.g. light) source 41 and a corresponding detector 42. One or more radiation wavelengths are directed down to the features being etched on the wafer 30 and the reflected radiation interferes with the incident radiation resulting in interference fringes 43. The number of interference fringes 43 can be counted (e.g. by moving detector 42 through the interference region) in order to infer the depth of the feature F. The endpoint is known to be reached when the correct number of interference fringes 43 corresponding to the desired depth is counted.

In FIG. 10b, the wafer 30 itself is provided with a stop layer 35 of material having a different composition from that of the layer 31 to be etched, e.g. silicon oxide. Here, the composition of the material currently being etched (i.e. that forming the base of the etch feature F at any one instance) is sensed by using a radiation collector such as optical fibre 45 to view radiation within the chamber emitted by the process. The collector 45 can be connected to a spectrometer 46 to select certain wavelengths which correspond to known atomic transitions which occur when the relevant materials are etched. Alternatively, optical filters could be used to select the wavelength(s) to which the sensor is responsive to achieve the same effect. When the etch depth reaches the embedded stop layer (or other feature), there will be a corresponding change in the emitted wavelengths. For example, if the device 40 is configured to view appropriate fluorine lines then during silicon etching (e.g. position q in FIG. 10b), the intensity of the lines should be low due to the use of fluorine in the etch reaction. On reaching an underlying insulating layer (position r), the intensity of the fluorine line(s) should increase since fluorine is no longer consumed.

Upon detecting that the etch feature has reached the desired endpoint, the device 40 outputs a signal to the controller. This can be utilised in a number of alternative ways to bring the processing to a stop, as summarised in the flow chart of FIG. 11. Initially, in step 50, the etching process is performed as described in any of the preceding embodiments. For each of reference, this is described in FIG. 11 as "process cycle A", involving an appropriate series of process steps for achieving the desired etch rate and efficiency. In step 52, the system waits for the endpoint detection device 40 to sense that the endpoint has been reached and upon doing so, an endpoint signal is output (step 53).

In a first implementation, upon receipt of the endpoint signal, the controller instructs the set of devices to cease processing and the etching is halted. However as mentioned previously it is often the case that the endpoint will be reached in certain regions of the wafer (typically the centre) before others. Hence, to allow for an "over etch" a predetermined delay period may be allowed to elapse (step 56) before the processing is halted (step 58).

In a second implementation, when the endpoint signal is received, process cycle A is stopped and a new process cycle (process cycle "B") initiated (step 60). Process cycle B may for example comprise a similar series of steps as those of cycle A, but with adjusted process parameters and/or timings to achieve a less aggressive (i.e. slower) etch, or to change the spatial variation of etch rate within the chamber. For example, process cycle B may be adapted to etch more quickly towards the wafer edge than at the centre so as to complete the etching of features near the edge of the wafer whilst keeping the amount of over etching at the centre of the wafer small. This can be achieved for instance by increasing chamber pressure in the passivation process phase so that more passivation material is deposited in the wafer centre than near the edge (the deposition profile across the wafer changes with pressure). Alternatively, if the etch process is slowed by increasing the length of the passivation step compared with the etch step, then more passivation will help to protect the sidewalls near the base of any features which have already been etched down to the underlying layer, thereby again helping to reduce the level of notching.

The invention claimed is:

1. A method for depositing material onto and etching material from a substrate in a surface processing tool having a processing chamber, a controller and one or more devices for adjusting process parameters within the chamber, the method comprising:
   instructing, using the controller, the one or more devices according to a series of control steps, each control step specifying a defined set of process parameters that the one or more devices are instructed to implement, wherein at least one of the control steps comprises:
   implementing, using the one or more devices, a defined set of constant process parameters for the duration of the step, wherein the process parameters comprise a chamber pressure and total gas flow rate through the chamber, wherein the duration of the step is less than the corresponding gas residence time ($T_{gr}$) of the processing chamber for the step such that there is insufficient time for the chamber to reach steady state conditions during the step, wherein:

$$T_{gr} = \frac{pV}{Q}$$

wherein:
   p is the chamber pressure in units of Pa;
   V is the volume of the processing chamber in units of m$^3$; and
   Q is the total gas flow rate through the processing chamber in units of Pa·m$^3$·s$^{-1}$; and
   wherein a first sequential subset of one or more of the series of control steps constitutes a passivation process phase during which the processing parameters are selected for depositing a passivation layer on the substrate, and a second sequential subset of one or more of the series of control steps constitutes an etching process phase during which the processing parameters are selected for etching the substrate.

2. A method according to claim 1, wherein the corresponding gas residence time ($T_{gr}$) of the processing chamber for the at least one of the control steps is between 0.1 and 5 seconds.

3. A method according to claim 1, wherein the or each control step comprising instructing the one or more devices to implement a defined set of constant process parameters for the duration of the step, which duration is less than the corresponding gas residence time ($T_{gr}$) of the processing chamber for the step, has a duration of less than 1 second.

4. A method according to claim 1, wherein the first and second sequential subsets of control steps form a cycle which is repeated such that the passivation process phase and etching process phase are performed alternately.

5. A method according to claim 4, wherein the second sequential subset of control steps constituting the etching process phase comprises a first portion during which the processing parameters are selected for partial removal of the passivation layer in a passivation layer removal process sub-phase, and a second portion during which the processing parameters are selected for etching of the exposed substrate in a substrate etch process sub-phase.

6. A method according to claim 5, wherein at least 50% of the total duration of the cycle corresponds to the substrate etch process sub-phase.

7. A method according to claim 5, wherein during at least one of the control steps constituting the passivation layer removal process sub-phase, the process parameters comprise directional, ion-assisted etching.

8. A method according to claim 5, wherein during at least one of the control steps constituting the substrate etch process sub-phase, the process parameters comprise substantially isotropic, chemical etching.

9. A method according to claim 5, wherein during at least one of the control steps constituting the passivation layer removal process sub-phase, preferably the core passivation layer removal step, the one or more devices are instructed to apply an alternating bias voltage to the substrate, the frequency of which is preferably at least 50 kHz.

10. A method according to claim 5, wherein the passivation layer removal process sub-phase comprises a core sequence of control steps by means of which the one or more devices are alternately instructed to implement zero substrate bias power or a nominal bias power of less than 300 W/m² in one control step, and a higher substrate bias power of between 1500 and 8000 W/m² in the next control step.

11. A method according to claim 1, wherein the process parameters include any of: the gas flow rate of at least one input gas, the pressure within the chamber, the exhaust pumping speed, wafer backside gas pressure, plasma source power or frequency, substrate bias power or frequency, and impedance matching settings.

12. A method according to claim 1, wherein the defined set of constant process parameters implemented during the at least one of the control steps having a duration less than the gas residence time ($T_{gr}$) of the processing chamber includes process parameters selected to give rise to different gas conditions within the chamber relative to those of the preceding and/or subsequent control steps, wherein the different gas conditions are selected from the group consisting of a different gas flow rate of at least one input gas, a different pressure within the chamber, a different exhaust net pumping speed, a different temperature, and a combination thereof.

13. A method according to claim 1, wherein the one or more devices comprises a plurality of devices and the series of control steps includes one or more transition control steps, in each of which one or a subset of the devices is instructed to effect a change in a corresponding process parameter, the timing of the or each transition control step being related to the known response time of the instructed device(s), wherein the change in the corresponding process parameter is selected from the group consisting of an increase in flow rate, a decrease in flow rate, a change in pressure, a change in temperature, and a combination thereof.

14. A method according to claim 13, wherein the series of control steps includes a sequence of transition control steps, according to which individual ones or subsets of the plurality of devices are instructed to effect changes in corresponding process parameters in sequence according to the devices' known response times, whereby the instructed changes to the corresponding process parameters are effected substantially in synchronicity with one another, preferably substantially simultaneously, wherein the changes in the corresponding process parameters are selected from the group consisting of an increase in flow rate, a decrease in flow rate, a change in pressure, a change in temperature, and a combination thereof.

15. A method according to claim 1, wherein each of the control steps in the series has a duration which is less than the corresponding gas residence time ($T_{gr}$) of the processing chamber for the step.

16. A method according to any claim 1, wherein the net effect of the series of control steps is the etching of material from the substrate, the method further comprising monitoring the substrate as the etching progresses, detecting when the etching has reached a predetermined endpoint, and outputting an endpoint signal.

17. A method according to claim 16, further comprising halting the series of control steps in response to the endpoint signal.

18. A method according to claim 16, further comprising starting a second, different, series of control steps in response to the endpoint signal.

19. A method according to claim 16, wherein the monitoring the substrate comprises monitoring the etching depth, preferably using an optical interferometer, and the predetermined endpoint is a predetermined etching depth.

20. A method according to claim 16, wherein the monitoring the substrate comprises monitoring the composition of the material being etched, the substrate comprising a stop layer underlying and of a different composition to the layer to be etched, the endpoint detection signal being output when a change in composition is detected.

21. A method according to claim 5, wherein at least one of the process phases and sub-phases comprises a core process step and one or more intermediate control steps before and/or after the core process step, the or each of the intermediate control steps comprising instructing the one or more devices to implement a defined set of constant process parameters of which at least one has a value which lies between that of the same process parameter in the core process step and in the preceding or subsequent process phase or sub-phase.

22. A method according to claim 21, wherein the or each of the intermediate control steps comprises instructing the one or more devices to input gas comprising a mixture of first and second species into the chamber, the core process step comprising instructing the one or more devices to input gas predominantly of the first species into the chamber and the preceding or subsequent process phase or sub-phase comprising instructing the one or more devices to input gas predominantly of the second species into the chamber.

23. A method according to claim 22, wherein in a plurality of consecutive intermediate control steps, the one or more devices are instructed to input gas comprising respective mixtures of the first and second species into the chamber, wherein the ratio of the first species to the second species in each consecutive mixture varies, whereby a gradual transition from the first gas species to the second species is effected.

24. A method according to claim 21, wherein the series of control steps includes a plurality of intermediate control steps between at least one pair of adjacent core process steps in the cycle, the defined set of process parameters implemented by each of the intermediate control steps varying from one intermediate control step to the next so as to effect a gradual change in the process parameters between the pair of adjacent core process steps.

25. A method according to claim 21, wherein the duration of the or each intermediate process step, during which the one or more devices are instructed to implement the defined set of constant intermediate process parameters, is less than the corresponding gas residence time ($T_{gr}$) of the processing chamber for the step, which is defined as:

$$T_{gr} = \frac{pV}{Q}$$

Where:
p is the chamber pressure in units of Pa;
V is the volume of the processing chamber in units of m³; and
Q is the gas flow rate through the chamber in units of Pa·m³·s⁻¹.

26. A method according to claim 25, wherein the sum of the duration(s) of the or each intermediate process step between adjacent core process steps in the cycle is less than the average gas residence time ($T_{gr}$) of those intermediate process steps.

27. A method of etching material from a substrate in a surface processing tool, the substrate comprising a semiconducting or conducting layer provided with an overlying or underlying insulating layer, the surface processing tool comprising a processing chamber, a controller and a plurality of devices for adjusting the process parameters within the chamber, including a bias power source for applying a bias voltage to the substrate, the method comprising:

the controller alternately instructing the plurality of devices to implement a cycle of etching and passivation process phases, one after another, and, during at least part of at least one of the alternate process phases, controlling the power source in an alternating sequence of steps, comprising the controller alternately instructing the power source to output a bias voltage with a first magnitude for the duration of a first step of the alternating sequence, and then to output a bias voltage with a second magnitude for the duration of a second step of the alternating sequence, wherein the second magnitude is higher than the first magnitude, whereby the formation of side wall notches at an interface between the semiconducting or conducting layer and the insulating layer is reduced.

\* \* \* \* \*